(12) United States Patent
Bhushan et al.

(10) Patent No.: US 9,786,839 B2
(45) Date of Patent: Oct. 10, 2017

(54) 3D MRAM WITH THROUGH SILICON VIAS OR THROUGH SILICON TRENCHES MAGNETIC SHIELDING

(71) Applicant: GLOBALFOUNDRIES Singapore Pte. Ltd., Singapore (SG)

(72) Inventors: Bharat Bhushan, Singapore (SG); Juan Boon Tan, Singapore (SG); Wanbing Yi, Singapore (SG); Pak-Chum Danny Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/259,032

(22) Filed: Sep. 7, 2016

(65) Prior Publication Data
US 2017/0025601 A1   Jan. 26, 2017

Related U.S. Application Data

(63) Continuation-in-part of application No. 15/080,562, filed on Mar. 24, 2016.
(Continued)

(51) Int. Cl.
*H01L 27/22* (2006.01)
*H01L 43/08* (2006.01)
(Continued)

(52) U.S. Cl.
CPC ............ *H01L 43/08* (2013.01); *G11C 11/161* (2013.01); *G11C 14/009* (2013.01); *G11C 14/0036* (2013.01); *G11C 14/0045* (2013.01); *G11C 14/0081* (2013.01); *H01L 23/49816* (2013.01); *H01L 23/49827* (2013.01); *H01L 27/222* (2013.01); *H01L 27/228* (2013.01);
(Continued)

(58) Field of Classification Search
None
See application file for complete search history.

(56) References Cited

U.S. PATENT DOCUMENTS

| 7,545,662 B2 | 6/2009 | Wang et al. |
| 7,772,679 B2 | 8/2010 | Chang et al. |
| 8,796,046 B2 | 8/2014 | Chen et al. |

(Continued)

*Primary Examiner* — Minh-Loan Tran
(74) *Attorney, Agent, or Firm* — Horizon IP Pte. Ltd.

(57) ABSTRACT

Emerging memory chips and methods for forming an emerging memory chip are presented. For example, magnetoresistive random access memory (MRAM) chip magnetic shielding and vertical stacking capabilities processed at the wafer-level are disclosed. The method includes providing a magnetic shield in the through silicon vias and/or through silicon trenches surrounding or adjacent to magnetic tunnel junction (MTJ) array within the MRAM region and also at the front side and back side of the chip. Magnetic shield in the through silicon trenches connects front side and back side magnetic shield. Magnetic shield in the through silicon vias provides vertical stacking, magnetic shielding and electrical connection of the MRAM chips to form 3D IC packages. This magnetic shielding method is applicable for both in-plane and perpendicular MRAM chips. The MTJ array is formed in the MRAM region and in between adjacent inter layer dielectric (ILD) levels of the upper ILD layer in the back end of line (BEOL) of the MRAM chip.

20 Claims, 28 Drawing Sheets

Related U.S. Application Data

(60) Provisional application No. 62/326,855, filed on Apr. 25, 2016, provisional application No. 62/195,807, filed on Jul. 23, 2015.

(51) Int. Cl.
| | | |
|---|---|---|
| *H01L 43/12* | (2006.01) | |
| *H01L 43/02* | (2006.01) | |
| *H01L 23/498* | (2006.01) | |
| *G11C 14/00* | (2006.01) | |
| *H01L 27/24* | (2006.01) | |
| *G11C 11/16* | (2006.01) | |

(52) U.S. Cl.
CPC ...... *H01L 27/2463* (2013.01); *H01L 27/2481* (2013.01); *H01L 43/02* (2013.01); *H01L 43/12* (2013.01); *H01L 2224/11* (2013.01); *H01L 2224/16145* (2013.01); *H01L 2224/16225* (2013.01); *H01L 2924/15311* (2013.01)

(56) References Cited

U.S. PATENT DOCUMENTS

| | | | |
|---|---|---|---|
| 9,252,108 B2 * | 2/2016 | Fujimori | H01L 23/552 |
| 2010/0254182 A1 * | 10/2010 | Kuroiwa | G11C 11/16 |
| | | | 365/158 |
| 2011/0241140 A1 * | 10/2011 | Tsujiuchi | H01L 27/228 |
| | | | 257/421 |
| 2012/0193737 A1 | 8/2012 | Pang et al. | |
| 2015/0243607 A1 | 8/2015 | Jang et al. | |
| 2016/0172580 A1 * | 6/2016 | Matsubara | H01L 23/552 |
| | | | 257/422 |

\* cited by examiner

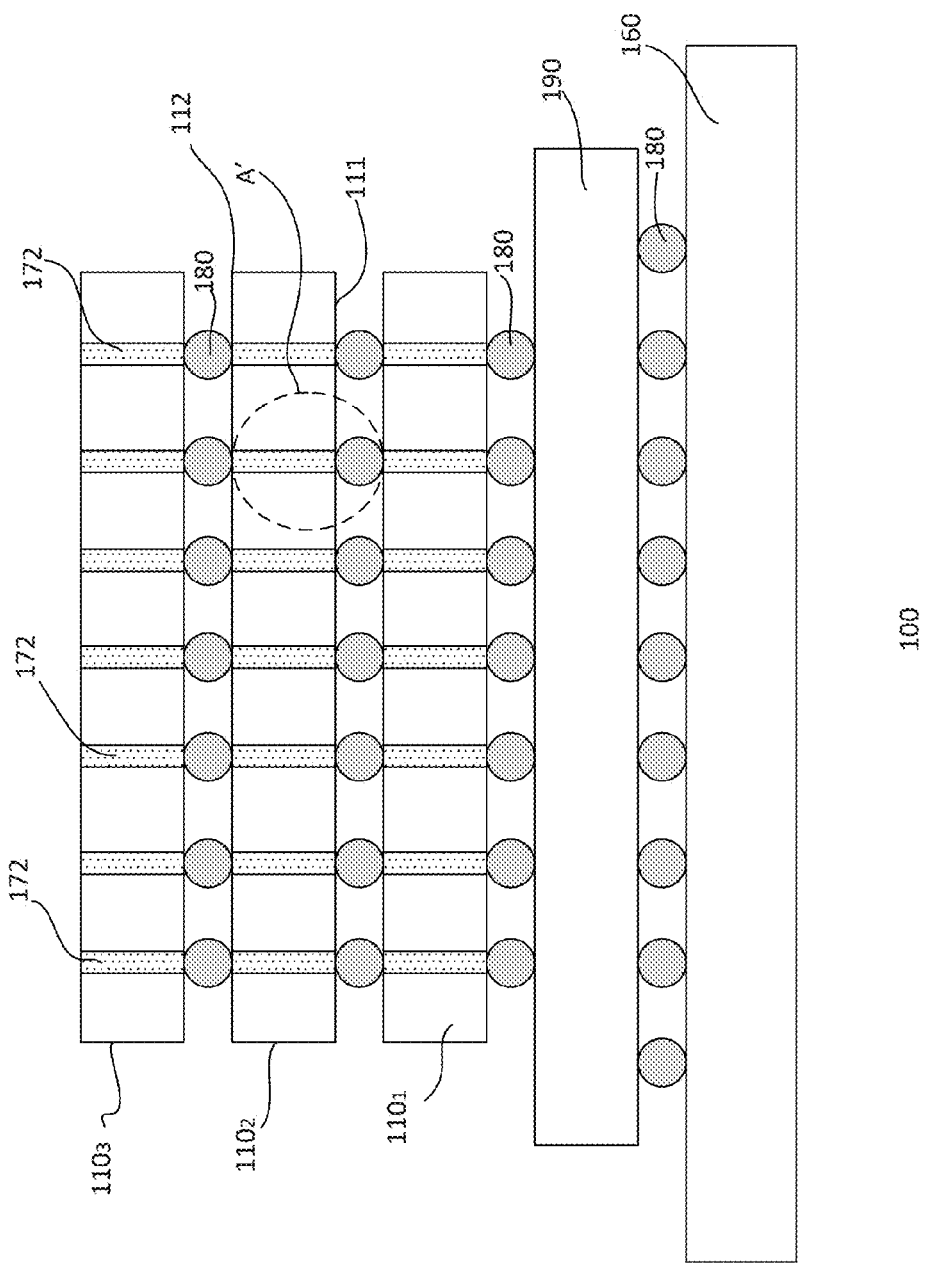

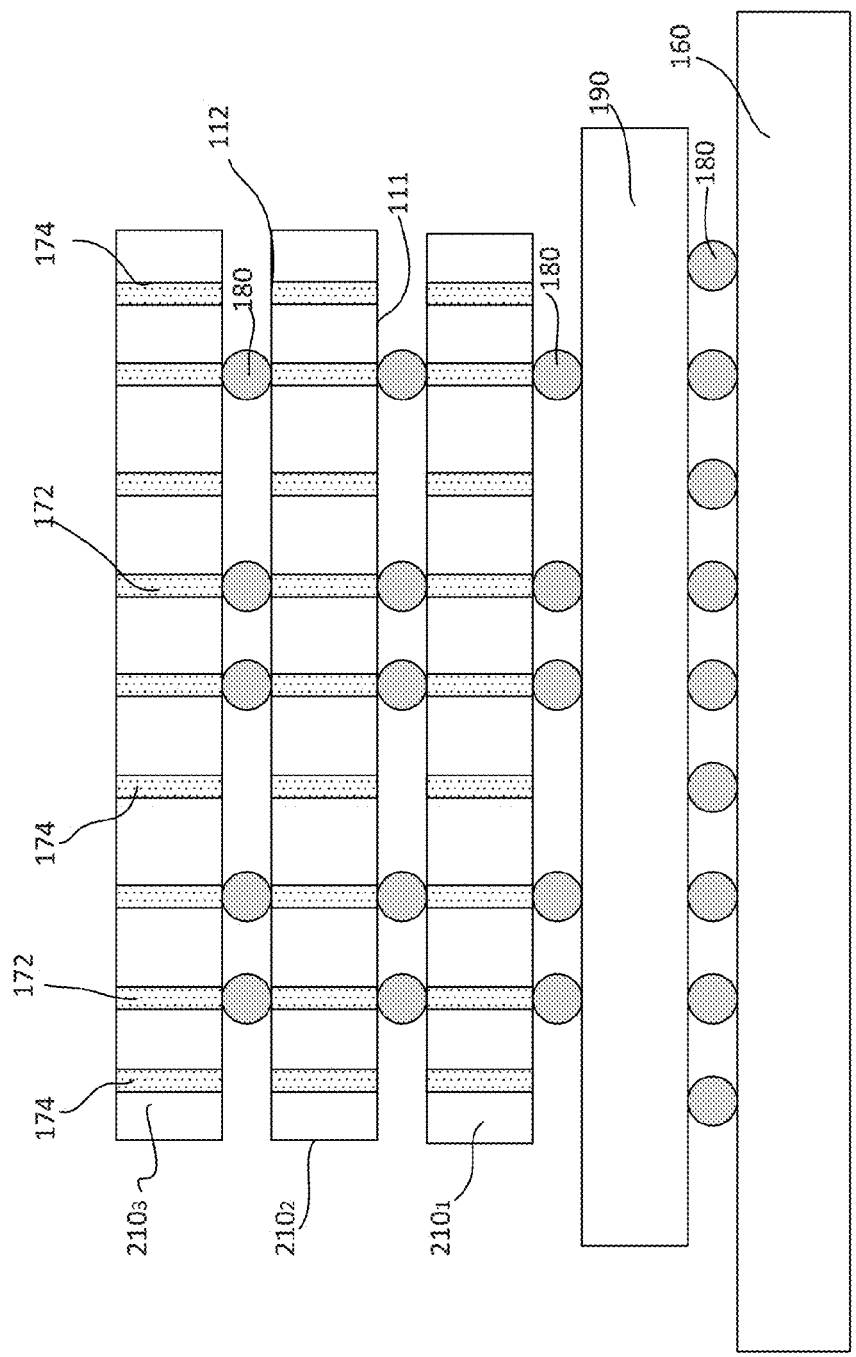

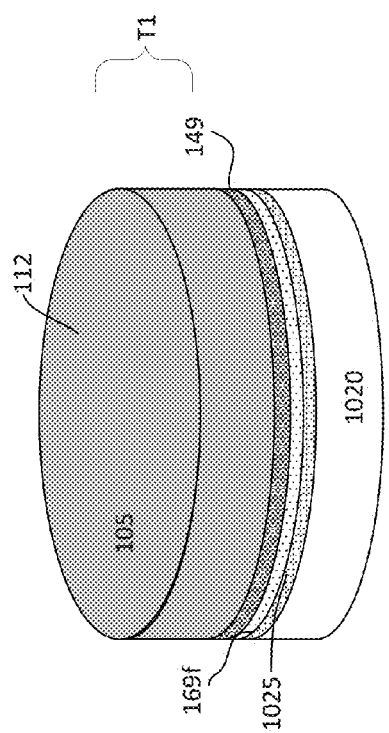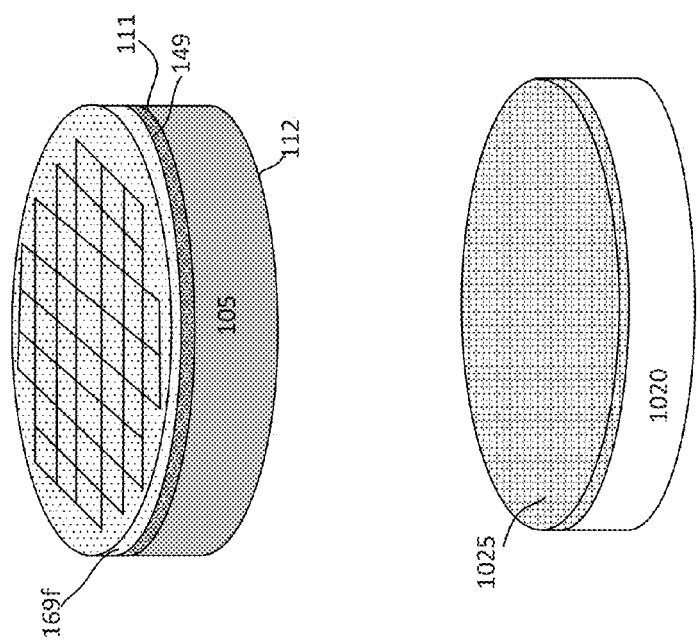

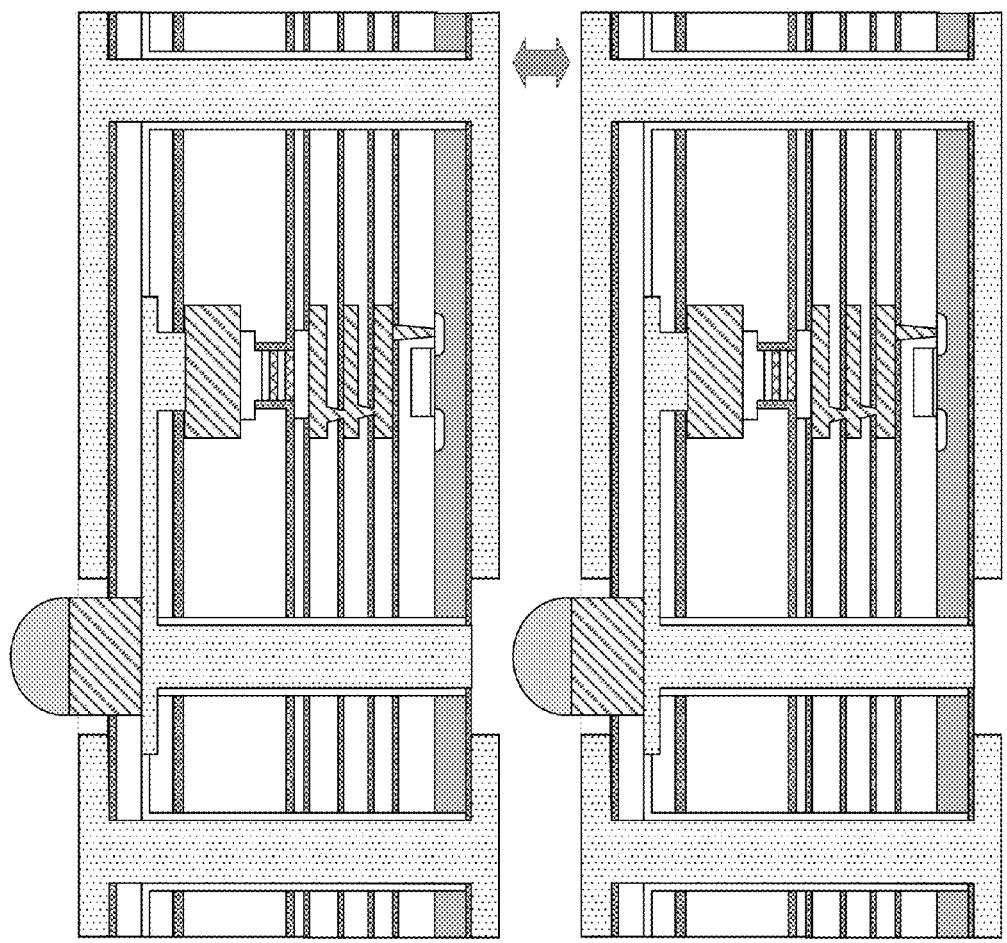

US 9,786,839 B2

3D MRAM WITH THROUGH SILICON VIAS OR THROUGH SILICON TRENCHES MAGNETIC SHIELDING

CROSS-REFERENCE TO RELATED APPLICATIONS

This application claims the priority benefit of U.S. Provisional Application Ser. No. 62/326,855, filed on Apr. 25, 2016 and is a continuation-in-part of copending U.S. patent application Ser. No. 15/080,562, filed on Mar. 24, 2016 which claims the priority benefit of U.S. Provisional Application Ser. No. 62/195,807, filed on Jul. 23, 2015, the disclosures of which are hereby incorporated by reference in their entireties for all purposes.

BACKGROUND

Magnetoresistive random access memory (MRAM) is a non-volatile random access memory which gains popularity in recent years as potential replacement for dynamic random access memory (DRAM), static random access memory (SRAM) and flash. MRAM, for example, includes magnetic tunnel junction (MTJ) element which uses magnetic polarization to store information. For example, READ and WRITE operations of the MRAM device rely on the MTJ element. However, magnetic interferences can be a problem for MRAM devices. For instance, MTJ functions can be affected by an external magnetic field. The external magnetic field may come from sources of magnetic flux such as power lines, bar magnets, or the earth. The external magnetic fields not only distort magnetic signals within the MTJ memory, but also induce changes on electrical signals of the circuits. READ and WRITE operations in MRAM devices are inevitably affected by external magnetic fields. These cause reliability issues in MRAM devices. As technology advances, there is also a desire to integrate and vertically stack MRAM chips with other suitable chips, including but not limited to logic chip, in a single package to form a 3-dimensional (3D) integrated circuit (IC) package.

Accordingly, there is a need to provide reliable and cost effective wafer-level processing which provides for magnetic shielding to protect the MRAM chip from external magnetic fields and stacking of MRAM chips with other chips in a vertical manner.

SUMMARY

Embodiments of the present disclosure generally relate to MRAM chips or dies with at least through silicon vias (TSV) and/or through silicon trenches (TST) magnetic shield and methods of forming thereof. In one embodiment, a method of forming a magnetoresistive random access memory (MRAM) chip is disclosed. The method includes providing a substrate having first and second surfaces. The first surface is defined with a MRAM region and the second surface of the substrate defines a back side of the MRAM chip. An upper inter level dielectric (ILD) layer is formed over the first surface of the substrate. The upper ILD layer includes a plurality of ILD levels. A magnetic storage element having a magnetic tunneling junction (MTJ) array with MTJ stack is formed in the MRAM region and in between adjacent ILD levels of the upper ILD layer. A pad level is formed over the magnetic storage element. The pad level defines a front side of the MRAM chip. At least a through silicon via magnetic shield contact structure which extends from the front side to the back side of the MRAM chip is formed. In some other embodiments, the method may also include forming through silicon trench magnetic shield structure as well as forming front and back side magnetic shield layers which are coupled to the through silicon trench magnetic shield structure.

In another embodiment, a magnetoresistive random access memory (MRAM) chip is presented. The MRAM chip includes a substrate having first and second surfaces. The first surface is defined with a MRAM region and the second surface of the substrate defines a back side of the MRAM chip. An upper inter level dielectric (ILD) layer is disposed over the first surface of the substrate. The upper ILD layer includes a plurality of ILD levels. A magnetic storage element having a magnetic tunneling junction (MTJ) array with MTJ stack is disposed in the MRAM region and in between adjacent ILD levels of the upper ILD layer. A pad level is disposed over the magnetic storage element. The pad level defines a front side of the MRAM chip. The MRAM chip includes at least a through silicon via magnetic shield contact structure which extends from the front side to the back side of the MRAM chip.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIG. 1a shows an embodiment of a 3D semiconductor package having a plurality of MRAM chips vertically stacked on a logic chip, FIG. 1b shows a simplified top view of an embodiment of a MRAM chip of the package while

FIG. 2a shows another embodiment of a 3D semiconductor package having a plurality of MRAM chips vertically stacked on a logic chip, FIG. 2b shows a simplified top view of an embodiment of a MRAM chip of the package while

DETAILED DESCRIPTION

Embodiments of the present disclosure generally relate to MRAM chips or dies and methods for forming MRAM chips having chip-level magnetic shield protections processed at the wafer-level. The MRAM chip or die, for example, includes at least through silicon via (TSV) contact structure which provides for magnetic shield protection as well as vertical stacking of MRAM chip to form 3D IC or semiconductor package. In some embodiments, the MRAM chip or die includes through silicon via and through silicon trench (TST) magnetic shield structures as well as front side and back side magnetic shield protection layers. The MRAM chip or die may be spin transfer torque magnetic random access memory (STT-MRAM) chip. The MRAM chip includes MRAM cell having a MTJ element. Other suitable types of memory chips may also be useful. The MRAM chip as will be described later in this disclosure which includes one or more through silicon via and/or through silicon trench magnetic shield structures such that the MRAM chip is protected against external magnetic interferences to prevent disturbance or change of spins in the magnetic storage element of the MRAM chip. Such MRAM chips or dies may be electrically connected and vertically stacked on top of each other and over other suitable chip, including logic chip, through the through silicon via magnetic shield structures to form 3D IC packages. Such semiconductor packages may be incorporated into electronic products or equipment, such as phones, computers as well as mobile and mobile smart products. Incorporating the packages into other types of products may also be useful.

FIG. 1a illustrates an embodiment of a semiconductor package 100. The semiconductor package 100, in one embodiment, includes a die stack. The die stack includes x number of MRAM dies, where x is ≥2. For example, the die stack includes MRAM dies $110_{1-x}$. Illustratively, the die stack includes three MRAM dies $110_1$-$110_3$. Providing other suitable number of MRAM dies may also be useful. The MRAM die, for example, is a singulated MRAM die of a MRAM wafer processed with a plurality of MRAM dies in parallel. A MRAM die of the die stack has first and second surfaces. One of the surfaces may be an active surface 111 having one or more active components defined thereon while the other surface may be an inactive surface 112. The MRAM die, for example, includes a magnetic memory component therein.

Figure 1B:
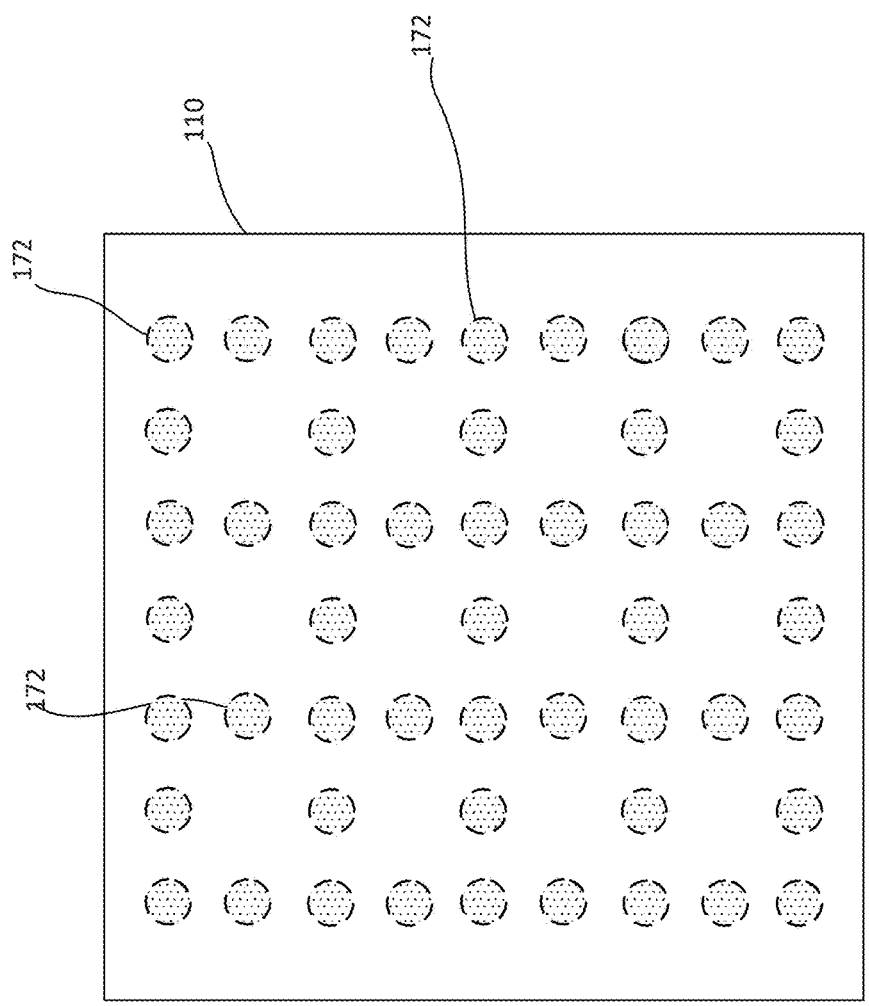

The MRAM die, in one embodiment, includes a plurality of via holes, such as through silicon vias or holes extending from the first surface 111 to the second surface 112 of the MRAM die. The through silicon vias, in one embodiment, may be filled with a conductive magnetic shield material to form through silicon via magnetic shield contact structures 172. The through silicon via magnetic shield contact structures allow vertical stacking of the MRAM dies and provide for electrical connections between adjacent MRAM dies of the die stack as shown in FIG. 1a. The through silicon via magnetic shield contact structures 172 may be arranged in various layout designs, for example, in a regular grid array arrangement as shown in FIG. 1b. Other suitable layout patterns may also be used. For example, the through silicon via magnetic shield contact structures 172 may be arranged in one or more rows disposed at about the center of the MRAM die or rows at the sides of the MRAM die or in a non-regular array, depending on the stacking and electrical connection requirements of the MRAM die.

Referring to FIG. 1a, die microbumps 180, for example, may be provided over the active surface 111 of the MRAM die. The die microbumps, for example, include contact bumps. As shown, the die microbumps 180 are coupled to the through silicon via magnetic shield contact structures 172. Details of the through silicon via magnetic shield contact structures and die microbumps will be described in detail with reference to FIG. 1c later.

Continuing with FIG. 1a, the vertically stacked MRAM dies are disposed over a chip 190. The chip 190, for example, includes a logic chip which serves as a controller for the MRAM dies or a logic microprocessor chip. Providing a die stack with other suitable number of MRAM dies and stacking the MRAM dies over other suitable device modules may also be useful. Referring to FIG. 1a, the semiconductor package 100 includes a package substrate 160. The package substrate, in one embodiment, is formed of various types of materials, including organic material, such as Bismaleimide Triazine (BT) or polyimide. Other suitable types of material, such as but not limited to laminate substrate, may be used to form the package substrate. The package substrate may serve as a medium for coupling the die stack to an external substrate or circuit board (not shown).

Figure 1C:
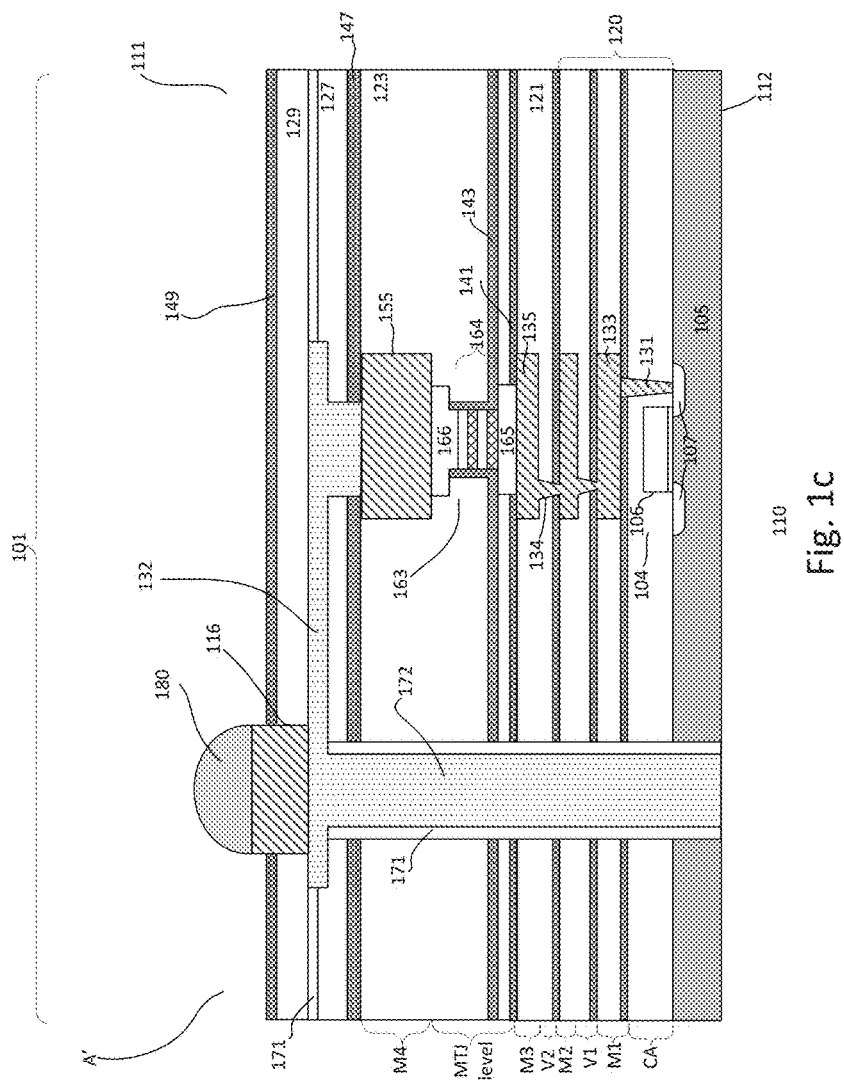
FIG. 1c shows an enlarged cross-sectional view of a portion of the MRAM chip having through silicon via magnetic shield structure.

FIG. 1c shows an enlarged cross-sectional view of a portion A' of the singulated or individual MRAM die 110 of the semiconductor package 100 of FIG. 1a. The MRAM die or chip, for example, includes an array of MRAM cells such as a non-volatile memory (NVM) cells. The MRAM cell, in one embodiment, is a STT-MRAM cell having MTJ bit element. Other suitable types of memory cell may also be useful.

The cross-sectional view, for example, is taken along a MRAM region 101 of the MRAM die 110. The MRAM cell, for example, is disposed in the MRAM region 101 of a substrate 105. The MRAM region, for example, may be an array region. For example, the array region may include a plurality of MRAM cell regions. For simplicity and illustration purpose, only one MTJ bit from an array of bits is shown. The substrate 105 may include other types of device regions (not shown in this cross-sectional view), such as logic, high voltage (HV), low voltage (LV) and intermediate voltage (IV) device regions. Other types of regions may also be provided.

As described, the MRAM cell is disposed on the substrate 105. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon dioxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material. The substrate may be a part of a MRAM wafer which is processed in parallel to form a plurality of MRAM dies.

The substrate includes a first (front side) surface and a second (back side) surface 112. Front end of line (FEOL) processing is performed on the first surface of the substrate. The FEOL process, for example, forms n-type and p-type transistors in the MRAM region as well as other regions on the substrate. The p-type and n-type transistors, for example, may include complementary MOS (CMOS) transistors and cell selector units. The FEOL processing, for example, includes forming isolation regions, various device and isolation wells, transistor gates and transistor source/drain (S/D) regions and contact or diffusion regions serving as substrate or well taps. Forming other components with the FEOL process may also be useful. For simplicity, only one transistor 104 and its gate 106 and S/D regions 107 are shown.

After the FEOL processing, back end of line (BEOL) processing is performed. The BEOL processing includes forming interconnects in interlevel dielectric (ILD) layers over the first surface of the substrate. The interconnects connect the various components of the integrated circuit (IC) to perform the desired functions. An ILD level includes a metal level and a via level. Generally, the metal level includes conductors or metal lines while the via level includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A die may include a plurality of ILD layers or levels. For example, x number of ILD levels may be provided. As illustrated, the die includes 4 ILD levels (x=4). Other suitable number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be, for example, silicon dioxide formed by chemical vapor deposition (CVD). The dielectric layer serves as a premetal dielectric layer or first contact layer of the BEOL process. The dielectric layer may be referred to as CA level of the BEOL process. Contacts 131 are formed in the CA level dielectric layer by using mask and etch techniques. A conductive layer, such as tungsten, may be deposited on the substrate by sputtering.

Conductive lines 133 are formed in the M1 level dielectric layer over the CA level. The conductive lines may be formed by a damascene technique using, for example, mask and etch techniques. The conductive material such as copper or copper alloy may be formed by, for example, plating, such as electro or electroless plating. The first metal level M1 and CA may be referred as a lower ILD level.

The process continues to form additional ILD layers or upper ILD layers/levels. The additional ILD levels may include ILD level 2 to ILD level x. For example, in the case where x=4 (4 levels), the additional levels include ILD levels from 2 to 4, which includes metal levels M2 to M4 and via levels V1 to V3. The number of ILD layers may depend on, for example, design requirements or the logic process involved. The ILD layers may be formed of silicon dioxide. Other types of dielectric materials, such as low k, or a combination of dielectric materials may also be useful. The ILD layers may be formed by, for example, CVD. Other techniques for forming the ILD layers may also be useful.

The conductors and contacts of the additional ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, physical vapor deposition (PVD) and/or electrochemical deposition (ECD) techniques. Other types of forming techniques may also be useful. Excess conductive material is removed by, for example, CMP, forming conductors and contacts in an ILD layer.

For simplicity and for illustration purpose, the ILD layers from CA level to M2 level may be collectively referred to as lower ILD layers 120 and dielectric liners, such as NBLoK, may be disposed in between adjacent ILD layers. As shown, a dielectric layer 121 is disposed over the lower ILD layers 120. For illustration purpose, the dielectric layer 121 may be referred to as a first upper dielectric layer and corresponds to ILD level 3. The ILD level 3, for example, includes a via level and a metal level. The ILD level 3, for example, includes via level V2 and metal level M3. One or more via contacts 134 may be disposed in V2 while one or more metal lines 135 may be disposed in M3. The metal line 135, for example, includes a conductive material, such as Cu.

A dielectric liner 141 is disposed over the first upper dielectric layer 121 covering the metal line 135. The dielectric liner, for example, serves as an etch stop layer. The dielectric liner may be a low k dielectric liner. For example, the dielectric liner may be NBLoK. Other suitable types of dielectric materials for the dielectric liner may also be useful.

A second upper dielectric layer 123 is disposed on the first upper dielectric layer 121 with the dielectric liner 141 in between. The second upper dielectric layer, in one embodiment, is Tetraethyl orthosilicate (TEOS). Any suitable dielectric materials and thicknesses for the second upper dielectric layer may be useful. The second upper dielectric layer, for example, may be a dielectric stack having one or more dielectric layers.

As shown in FIG. 1c, the MRAM region of the MRAM die accommodates a magnetic storage element 163 to form a MTJ bit cell, such as a STT-MRAM cell. In one example, the magnetic storage element is disposed in ILD level 4. ILD level 4, for example, includes a MTJ level and metal level M4. The magnetic storage element, as shown, is disposed in a dielectric layer between adjacent metal levels of upper ILD level. For illustration purpose, the magnetic storage element, is disposed in a dielectric layer which corresponds to the MTJ level in between metal levels M3 and M4. It is understood that the magnetic storage element may be disposed in between any suitable adjacent metal levels.

The magnetic storage element, in one embodiment, includes a MTJ bit element having a MTJ stack 164. The MTJ stack may be disposed between first and second electrodes. The first electrode 165, for example, may be a bottom electrode while the second electrode 166 may be a top electrode. The bottom electrode 165, for example, is connected to the metal line 135. For example, the bottom electrode may be disposed in the dielectric layer 123 extending through the dielectric liner 141 and is coupled to the metal line 135. For illustration purpose, the MTJ stack, for example, includes four layers. It is understood that the MTJ stack may include any suitable number of layers. For example, the MTJ stack generally includes a magnetically fixed (pinned) layer, one or more tunneling barrier layers and a magnetically free layer. The MTJ stack, for example, may include a bottom-pinned MTJ stack or a top-pinned MTJ stack. Top and bottom refer to position of layers relative to the substrate surface. The magnetic layers of the MTJ stack, for example, may have magnetic orientations in perpendicular/in-plane direction. The MTJ stack, as illustrated, is a simplified MTJ stack. An actual MTJ stack may include other suitable layers.

By way of example, the free layer and the fixed layer may be CoFeB or CoFe based composite material and the tunneling barrier layer may be MgO or $Al_2O_3$. As for the top and bottom electrodes, they may be Ti, TiN, TaN or Ta. Other suitable materials for the MTJ element may also be useful. The various layers of the MTJ stack and the top and bottom electrodes may be formed using suitable deposition techniques, including physical vapor deposition (PVD) and may be patterned using suitable mask and etch technique to achieve a desired configuration.

The top electrode, for example, may include a lower portion and an upper portion. The lower portion of the top electrode, for example, includes a length dimension which is about the same as the length dimension of the various layers of the MTJ stack. A protective liner 143 may optionally be provided to protect sidewalls of the MTJ stack. The protective liner, for example, may include SiN or other suitable dielectric materials. Other suitable configurations of the magnetic storage element may also be useful.

The dielectric layer 123, for example, includes a metal line 155. The metal line 155, for example, is disposed in metal level M4 and is coupled to the magnetic storage element 163. For example, the metal line 155 is disposed over and coupled to the top electrode 166 of the magnetic storage element. The metal line 155, for example, may serve as a bitline (BL). Providing the bitline at other metal levels may also be useful. Although one metal line 155 is shown, it is understood that there could be other suitable number of metal lines in the same metal level. The metal line 155, for example, may be referred to as the top metal line. The dimensions of this metal line 155, for example, may be defined at twice the minimum line resolution of the lithography and etch capability for a technology process node, which may be referred to as 2× design rule. For example, the thickness of the top metal line 155, for example, may be at least 2 times greater than the thickness of the metal line 135 below. The top metal line includes a conductive material, such as Cu. Other suitable configurations and conductive materials for the metal line may also be useful.

A pad level is disposed over the uppermost ILD level and may be referred to as a first surface (or front side) 111 of the MRAM chip or die 110. The pad level, for example, is disposed over Mx. In the case where the device includes 4 metal levels as illustrated in FIG. 1c, the pad level is disposed over M4. The pad level includes a pad dielectric stack. The pad dielectric stack, for example, includes a first pad dielectric layer 147 disposed over the dielectric layer 123 and a second pad dielectric layer 127 disposed over the first pad dielectric layer. For example, the first pad dielectric layer includes silicon nitride while the second pad dielectric layer includes TEOS. The first and second pad dielectric layers may be formed by CVD. Other suitable dielectric materials and forming techniques may also be useful.

In one embodiment, the MRAM die 110 includes a plurality of through silicon vias (TSV) or holes arranged in a suitable layout pattern (dotted lines shown in top view of FIG. 1b) disposed within the MRAM region 101. For simplicity and illustration purpose, only one through silicon via is shown in FIG. 1c. It is understood that the MRAM die may include any suitable number of through silicon vias and may be arranged in any desired layout pattern. The through silicon vias, for example, are disposed adjacent to the magnetic storage element 163. Referring to FIG. 1c, the through silicon vias extend from a top surface of the second pad dielectric layer 127 to a second (or bottom) surface 112 of the substrate 105. The through silicon via, for example, includes a diameter of about 5-10 μm and a depth of about 50-100 μm. Other suitable diameter and depth dimensions may also be useful.

The MRAM chip 110, in one embodiment, includes a dielectric liner 171 disposed over the top surface of the second pad dielectric layer and lines the sidewalls of the through silicon via. The dielectric liner, for example, includes an oxide liner. Other suitable dielectric material may also be used.

In one embodiment, the dielectric liner 171 and the pad level having the first and second pad dielectric layers 147 and 127 are defined with a pad interconnect opening which is in communication with the through silicon via. The pad interconnect opening, for example, includes a pad opening and a via opening. The pad opening is disposed through the dielectric liner and the second pad dielectric layer while the via opening is disposed through the first and second pad dielectric layers. The MRAM chip 110, in one embodiment, includes a magnetic shield layer which fills the through silicon via and the pad interconnect opening. The magnetic shield layer includes a magnetic shield material that does not function by excluding a magnetic field from itself, but rather by collecting and concentrating the magnetic field lines into itself and thereby diverting the field from the magnetically sensitive components to be protected. For example, the magnetic shield layer includes NiFe (Mμ metal) layer and may be formed by PVD/ECD. Other suitable types of magnetic shield layer and forming techniques may also be useful. As shown, the magnetic shield layer which fills the through silicon via and the pad interconnect opening forms a through silicon via magnetic shield contact structure 172 as well as a pad interconnect having a pad via contact disposed in the via opening and a die bump pad 132 disposed in the pad opening. As shown, the through silicon via magnetic shield contact structure 172 is coupled to the metal line 155 in the uppermost ILD level (e.g., M4) which is in electrical contact with the magnetic storage element 163 through the pad interconnect. The through silicon via magnetic shield contact structure 172 is isolated from the substrate by the dielectric liner 171.

As described, the magnetic shield layer fills the through silicon via and the pad interconnect opening. In such case, the through silicon via magnetic shield contact structure and the pad interconnect form a single unitary contact structure with the same magnetic shield material. As shown, the magnetic shield layer protects the MTJ bit element from external magnetic field in the vertical direction. In other embodiments, the through silicon via and the pad interconnect opening may be formed with different materials.

A passivation layer may be disposed over the pad dielectric layer. The passivation layer, in one embodiment, includes a passivation stack having first and second passivation layers. For example, the first passivation layer 129 is disposed over the pad dielectric layers and includes a passivation oxide layer while the second passivation layer 149 is disposed over the first passivation layer and includes a passivation nitride layer. Other suitable passivation materials may also be useful.

One or more die bump pad openings 116 are defined through a portion of the passivation layer and exposes a portion of the underlying die bump pad 132. In one embodiment, the opening 116 which exposes the die bump pad provides electrical connection to an external device, such as to another MRAM die or other suitable chip. For example, the die bump pad opening with the exposed portion of the die bump pad is configured for receiving a die microbump 180 which is attached to the exposed die bump pad 132 that is coupled to the through silicon via magnetic shield contact structure 172 and allows the MRAM chip or die to be electrically coupled to an external device. The die microbump, for example, may include contact bump. The die microbump may be in the form of, for example, spherical shaped structure, ball or bump. The die microbump may be formed of solder ball, copper pillar or copper alloy pillar with solder ball or other suitable types of conductive microbump.

FIG. 2a shows another embodiment of a semiconductor package 200. The semiconductor package 200 as shown in FIG. 2a is similar to the semiconductor package 100 as shown in FIG. 1a. For example, similar to the semiconductor package in FIG. 1a, the semiconductor package 200 also includes a die stack having a plurality of MRAM dies vertically stacked on top of each other and is disposed over a chip 190 which is coupled to a package substrate 160. Common elements or features having the same reference numerals may not be described or described in detail. In the interest of brevity, the description of the semiconductor package 200 below primarily focuses on the difference(s) compared with the semiconductor package 100 shown in FIG. 1a.

Figure 2B:
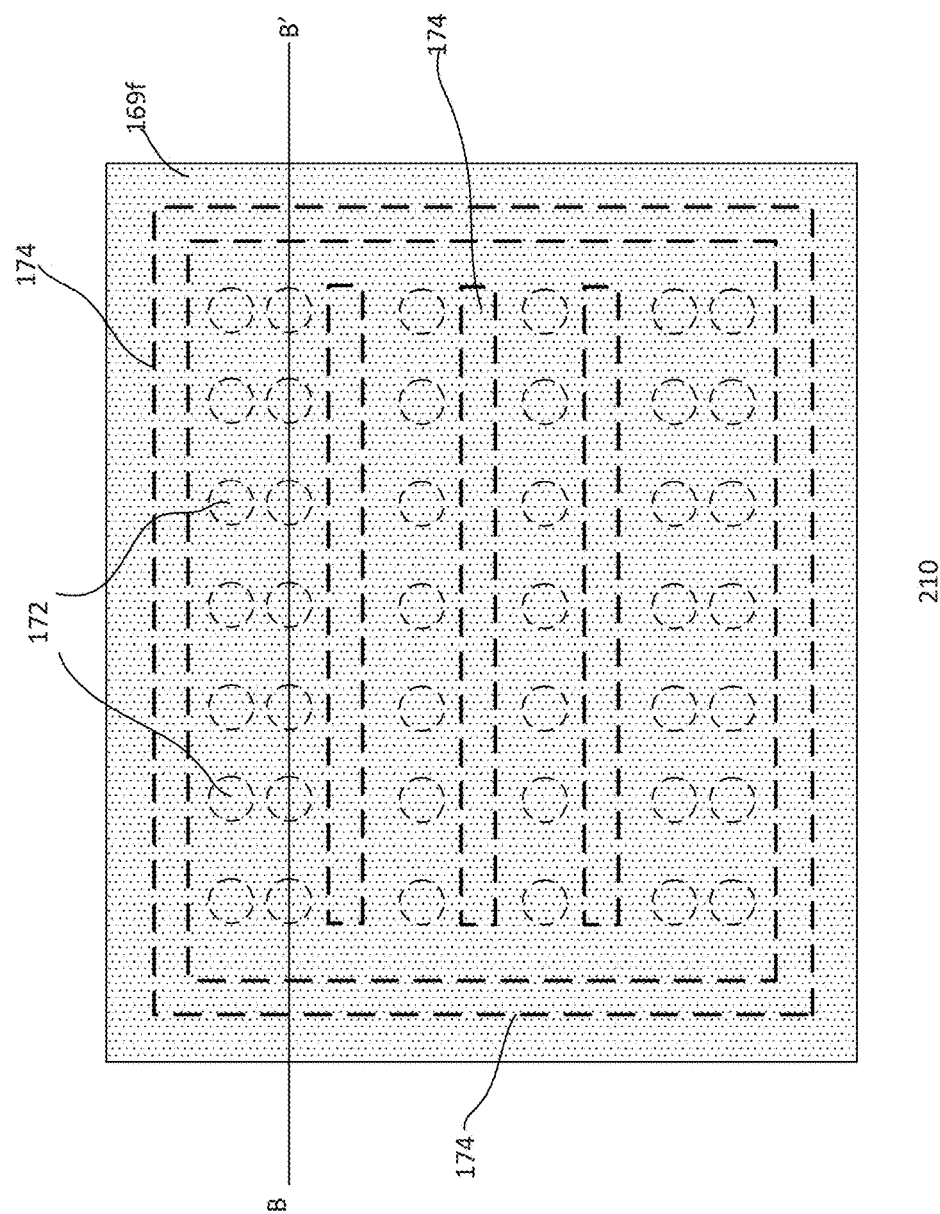

Referring to FIG. 2a, the die stack includes x number of MRAM dies, where x is ≥2. For example, the die stack includes MRAM dies $210_{1-x}$. Illustratively, the die stack includes three MRAM dies $210_1$-$210_3$. Providing other suitable number of MRAM dies may also be useful. Similar to the MRAM die shown in FIG. 1a, the MRAM die 210 also includes through silicon via magnetic shield contact structures 172 which are coupled to the die microbumps 180. In one embodiment, the MRAM chip or die 210 differs from the MRAM chip or die 110 in that the MRAM chip 210 further includes through silicon trenches (TST) which extend from the top surface of the passivation layer to the bottom surface (or back side) 112 of the thinned substrate. As will be described with respect to FIG. 2c later, the MRAM chip 210, in one embodiment, includes a front side magnetic shield layer 169f which is disposed over the passivation layer and fills the through silicon trenches to form through silicon trench magnetic shield structures 174 while a dielectric layer 128 and a back side magnetic shield layer 169b are disposed on the bottom surface (or back side) 112 of the thinned substrate. The through silicon via magnetic shield contact structures 172 and the through silicon trench magnetic shield structures 174 may be arranged in a layout design as shown in FIG. 2b. For example, through silicon trench magnetic shield structure 174 may be provided to surround the array of magnetic storage elements and/or within the array of magnetic storage elements while through silicon via magnetic shield contact structures 172 may be provided adjacent to the magnetic storage elements when viewed from top. Other suitable layout patterns may also be used, depending on the stacking and electrical connection requirements of the MRAM die. Details of the through silicon trench magnetic shield structures as well as the front and back magnetic shield layers will be described in detail with reference to FIG. 2c later.

Figure 2C:
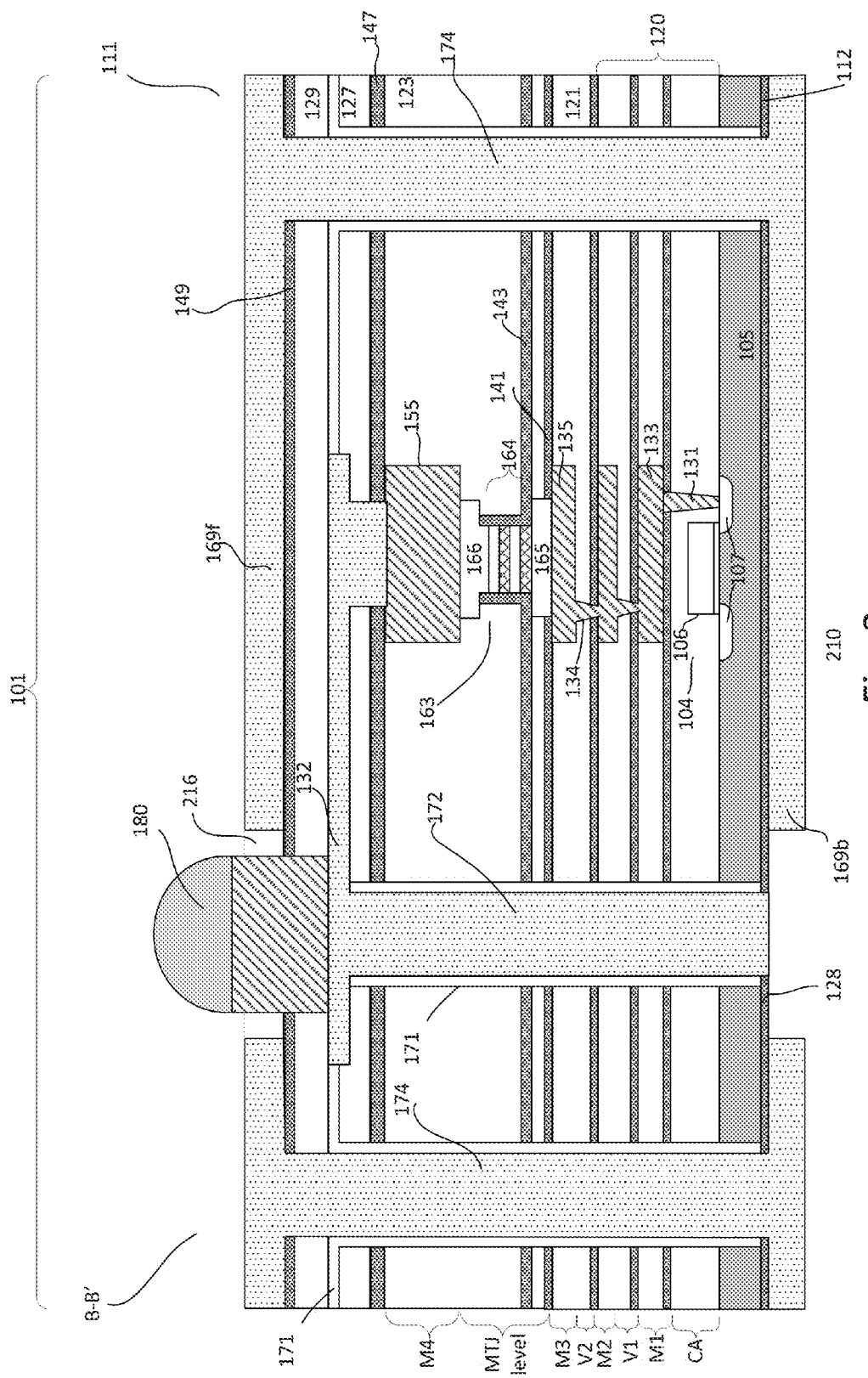
FIG. 2c shows an enlarged cross-sectional view of a portion of the MRAM chip having through silicon via and through silicon trench magnetic shield structures as well as front side and back side magnetic shield protections.

FIG. 2c shows an enlarged simplified cross-sectional view of a portion of the singulated or individual MRAM die 210 taken along B-B' of FIG. 2b. The enlarged cross-sectional view of the MRAM chip 210 as shown in FIG. 2c is similar to the enlarged cross-sectional view of the MRAM chip 110 as shown in FIG. 1c. For example, similar to the MRAM chip 110, the MRAM chip 210 also includes through silicon via magnetic shield contact structures 172. For simplicity, only one through silicon via magnetic shield contact structure 172 coupled to a MTJ bit from an array of through silicon via magnetic shield contact structures and bits is shown. Common elements or features having the same reference numerals may not be described or described in detail. In the interest of brevity, the description of the MRAM chip 210 with reference to FIG. 2c below primarily focuses on the difference(s) compared with the MRAM chip 110 as shown in FIG. 1c.

In one embodiment, the MRAM chip or die 210 further includes through silicon trenches (TST) which extend from the top surface of the second passivation layer 149 to the bottom surface (or back side) 112 of the thinned substrate. In one embodiment, the dielectric liner 171 also lines the top surface of the second pad dielectric layer 127 and portions of the sidewalls of the through silicon trenches. In one embodiment, a magnetic shield layer fills the through silicon trenches and a front side magnetic shield layer 169f is disposed over the second passivation layer 149 and fills the upper portions of the through silicon trenches to form the through silicon trench magnetic shield structures 174 while a dielectric layer 128 and a back side magnetic shield layer 169b are disposed on the bottom surface (or back side) 112 of the thinned substrate. The front and back side magnetic shield layers, for example, include the same magnetic shield material of the magnetic shield layer which fills the through silicon via. For example, the magnetic shield layer includes NiFe (Mµ metal) layer and may be formed by physical vapor deposition or electrochemical deposition (PVD/ECD). Other suitable magnetic shield materials and forming techniques may also be useful. As for the dielectric layer 128, it includes a silicon nitride. Other suitable dielectric material which provides adhesion and isolates the back side magnetic shield layer 169b from the thinned substrate may also be useful.

In one embodiment, the front side magnetic shield layer 169f, the back side magnetic shield layer 169b and the through silicon trench magnetic shield structure 174 surround the array of magnetic storage elements (MTJs). As shown, the through silicon trench magnetic shield structure 174 couples the front side magnetic shield layer 169f with the back side magnetic shield layer 169b. The front side and back side magnetic shield layers 169f and 169b as well as the through silicon trench magnetic shield structure 174 provide front side and back side as well as lateral magnetic shielding to protect the array of magnetic storage elements (MTJs) from external magnetic field. Thus, the array of MTJ bits is protected from magnetic field interferences on multiple sides of the chip or die.

As shown, one or more die bump pad openings 216 are defined to expose a portion of the underlying die bump pad 132. The die bump pad opening 216 is similar to the die bump pad opening 116. For example, the die bump pad opening 216 is configured for receiving a die microbump 180, such as contact bump or ball bump, which is attached to the exposed die bump pad 132 and allows the die to be electrically coupled to an external device. As shown, the die bump pad opening is defined through the front side magnetic shield layer and the passivation stack. The front side magnetic shield layer 169f, in one embodiment, is displaced away from the die microbump 180 and is floated.

The MRAM chips or dies 110 and 210 as described have various advantages. The MRAM chip or die 110 and 210, as described, includes through silicon via magnetic shield contact structures 172. The through silicon via magnetic shield contact structures allow vertical stacking of the MRAM dies and provide for electrical connections between adjacent MRAM dies of the die stack in a semiconductor package. Further, the through silicon via magnetic shield contact structure is also coupled to the magnetic storage element through the pad interconnect. Thus, the through silicon via magnetic shield contact structure which includes a conductive magnetic shield material provides stacking capability as well as magnetic shielding to protect the MTJ bit element from external magnetic fields in the vertical directions. The MRAM chip or die 210 as described further includes front and back side magnetic shield layers as well as through silicon trench magnetic shield structure which provide front side, lateral and back side magnetic shielding on multiple sides of the MRAM chip to protect the array of MTJ elements from external magnetic interference in all the directions.

Figure 3A:
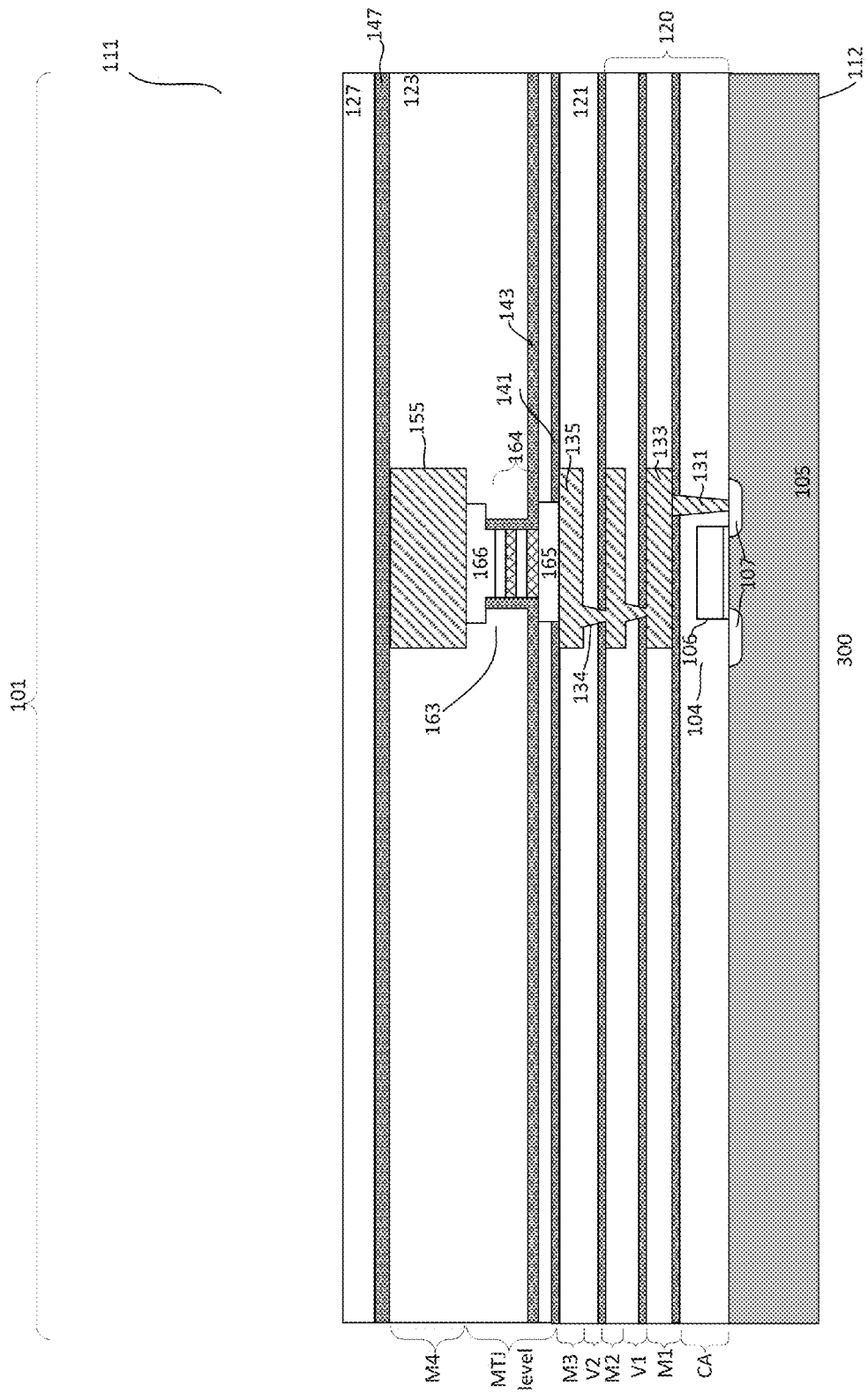
FIGS. 3a-3s show an exemplary embodiment of a process flow for forming a MRAM chip having through silicon via and through silicon trench magnetic shield structures as well as front side and back side magnetic shield protections.

FIGS. 3a-3s illustrate an embodiment of a process 300 for forming a MRAM chip or die. The MRAM chip or die formed by process 300 is similar or the same as the MRAM chip or die 210 as described in FIGS. 2a-2c. The MRAM die formed by process 300 may be stacked to form a semiconductor package 200 as shown in FIG. 2a. Common elements, indicated by the same reference numerals, may not be described or described in detail. For simplicity, the processes of forming transistors on the substrate 105 using FEOL processing and forming the ILD levels with various via contacts and metal lines as well as forming the magnetic storage element having MTJ stack in adjacent metal levels in the ILD layer using back end of line (BEOL) processing will not be described.

Referring to FIG. 3a, a portion of a processed MRAM wafer is shown. As shown, the magnetic storage element is defined within the MRAM region 101 while scribe/saw lane regions surrounding the MRAM region and other device regions are not shown. The process 300 is at the stage of wafer level processing immediately after forming a pad level having a first pad dielectric layer 147 and a second pad dielectric layer 127 covering the metal line 155 in the uppermost upper ILD layer (e.g., M4). For example, the first pad dielectric layer includes silicon nitride having a thickness of about 3000 Å while the second pad dielectric layer includes TEOS having a thickness of about 4500 Å. Other suitable dielectric materials and thicknesses may also be useful.

Figure 3B:
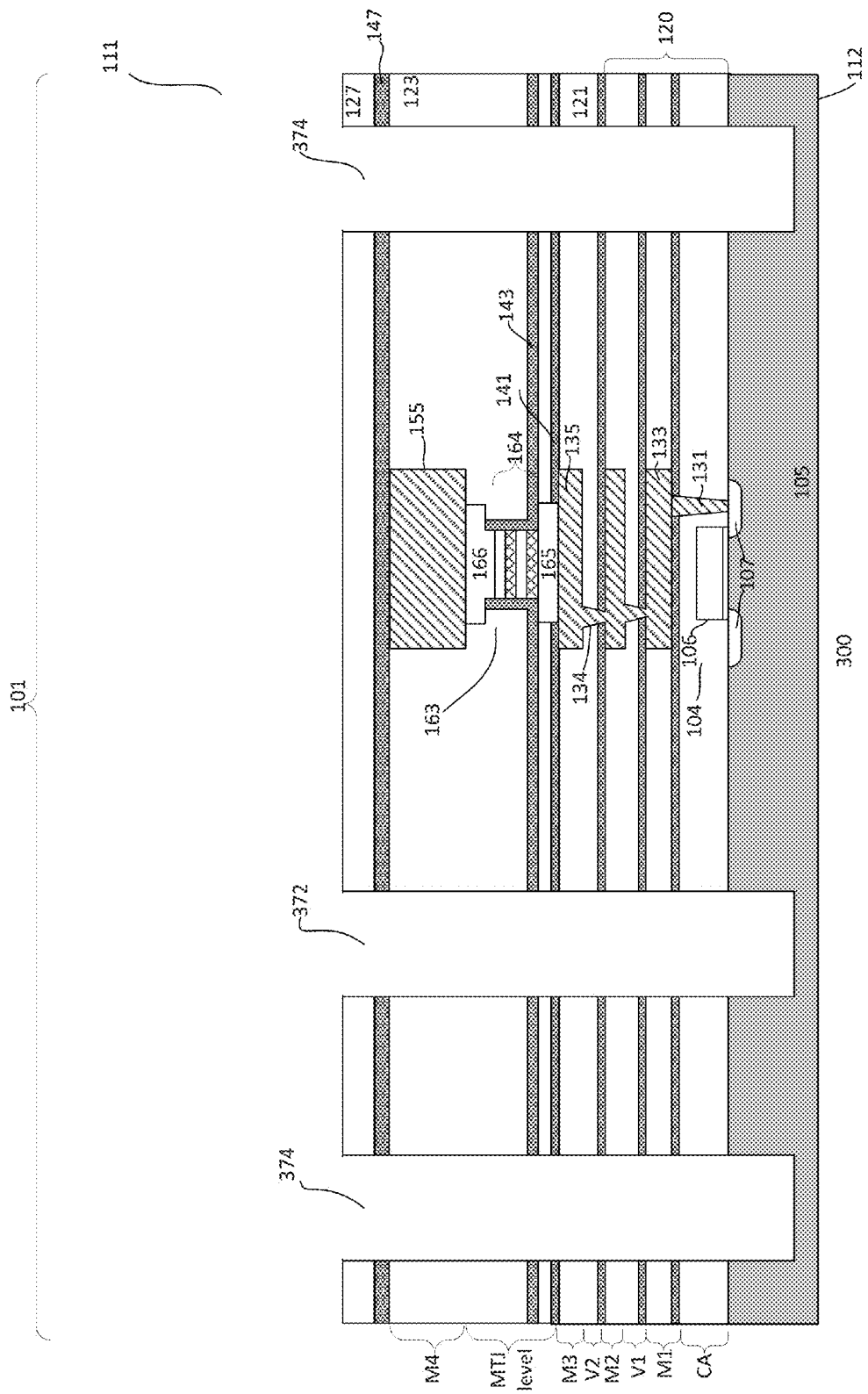

Referring to FIG. 3b, the process 300 continues by introducing deep vias and trenches through the wafer. In one embodiment, the deep vias and trenches are formed within the MRAM region 101. The deep vias and trenches, in one embodiment, include first type via opening and second type trench opening. The first type via opening 372, for example, corresponds to a through silicon via or through silicon hole opening for accommodating a through silicon via magnetic shield contact structure while the second type trench opening 374 corresponds to a through silicon trench opening for accommodating a through silicon trench magnetic shield structure as will be described later. The deep vias and trenches, for example, may be formed based on the layout pattern or design as shown and as described in FIG. 2b. For example, the second type trench opening 374 are formed surrounding or adjacent to an array of magnetic storage elements when viewed from top while first type via openings are formed adjacent to the magnetic storage elements. Other suitable layout pattern for the deep vias and trenches may also be useful. In one embodiment, the deep vias and trenches may be formed using deep reactive ion etch (DRIE) or any suitable techniques. The etch process, for example, forms deep vias and trenches 372 and 374 which extend partially into the substrate 105. In one embodiment, the deep vias and trenches 372 and 374 are formed simultaneously and extend from the top surface of the second pad dielectric layer 127 to within a portion of the substrate 105. The deep vias and trenches extend to within the substrate and the bottom of the deep vias and trenches terminate at a distance away from the bottom surface 112 of the substrate. The via openings, for example, include a diameter of about 5-10 μm and a depth of about 50-100 μm. The trench openings, for example, include a trench critical dimension (CD) of about 5-20 μm and a depth of about 50-100 μm. Other suitable CD and depth dimensions may also be useful. In other embodiments, the first type via opening 372 and the second type trench opening 374 of the deep vias and trenches may be formed separately and may have different CD and depth dimensions.

Figure 3C:
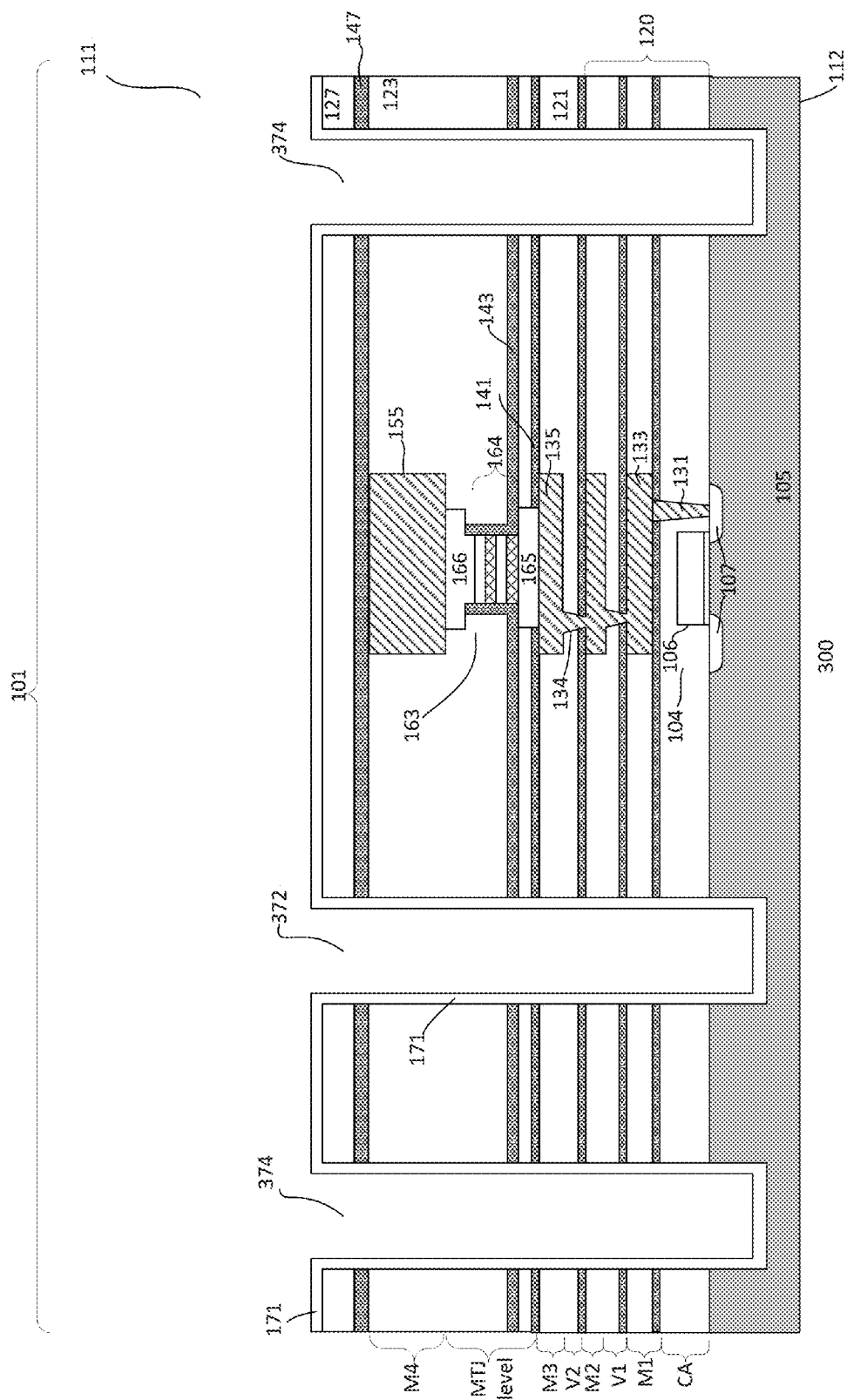

In FIG. 3c, the process 300 continues to form a dielectric liner 171 on the first surface (or front side) 111 of the wafer and sidewalls and bottom of the deep vias and trenches 372 and 374 within the MRAM region 101. The dielectric liner, in one embodiment, includes an oxide material and may be formed by CVD. The dielectric liner includes a thickness of about 1000-2000 Å. Other suitable dielectric materials, thickness dimensions and forming techniques may also be used.

Figure 3D:
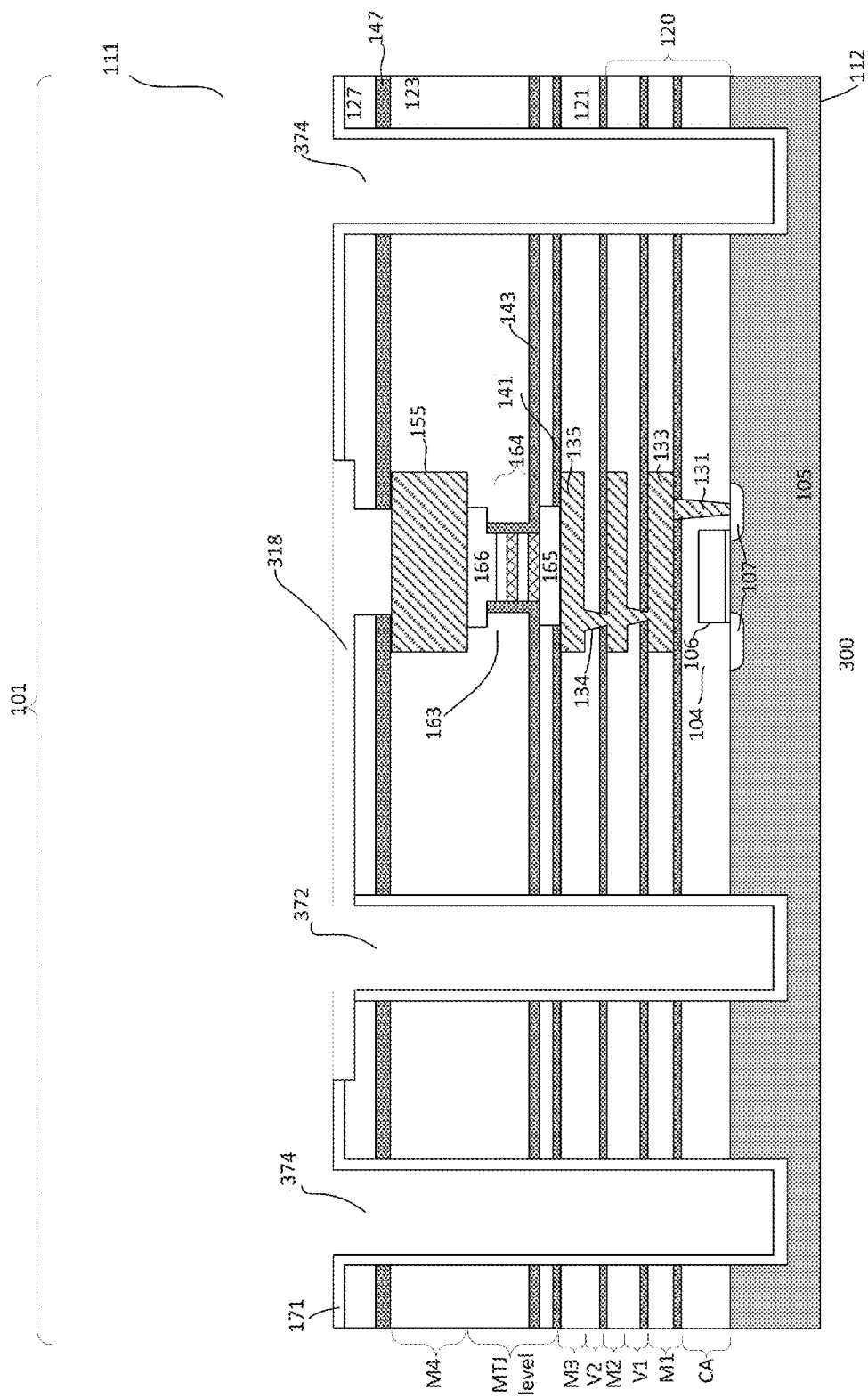

In one embodiment, the dielectric liner 171 and the pad level having the first and second pad dielectric layers 147 and 127 are patterned to define a pad interconnect opening 318 using suitable mask and etch technique. Exposed portions of the dielectric liner and first and second pad dielectric layers are removed by RIE. Other suitable techniques may also be useful. The pad interconnect opening 318, in one embodiment, is in communication with the deep via 372. The pad interconnect opening 318, for example, includes a pad opening and a via opening. The pad opening is formed through the dielectric liner 171 and the second pad dielectric layer 127 while the via opening is formed through the first and second pad dielectric layers 147 and 127 as shown in FIG. 3d. As shown, the via opening of the pad interconnect opening exposes a portion of the top surface of the metal line 155 which is coupled to the magnetic storage element 163.

Figure 3E:
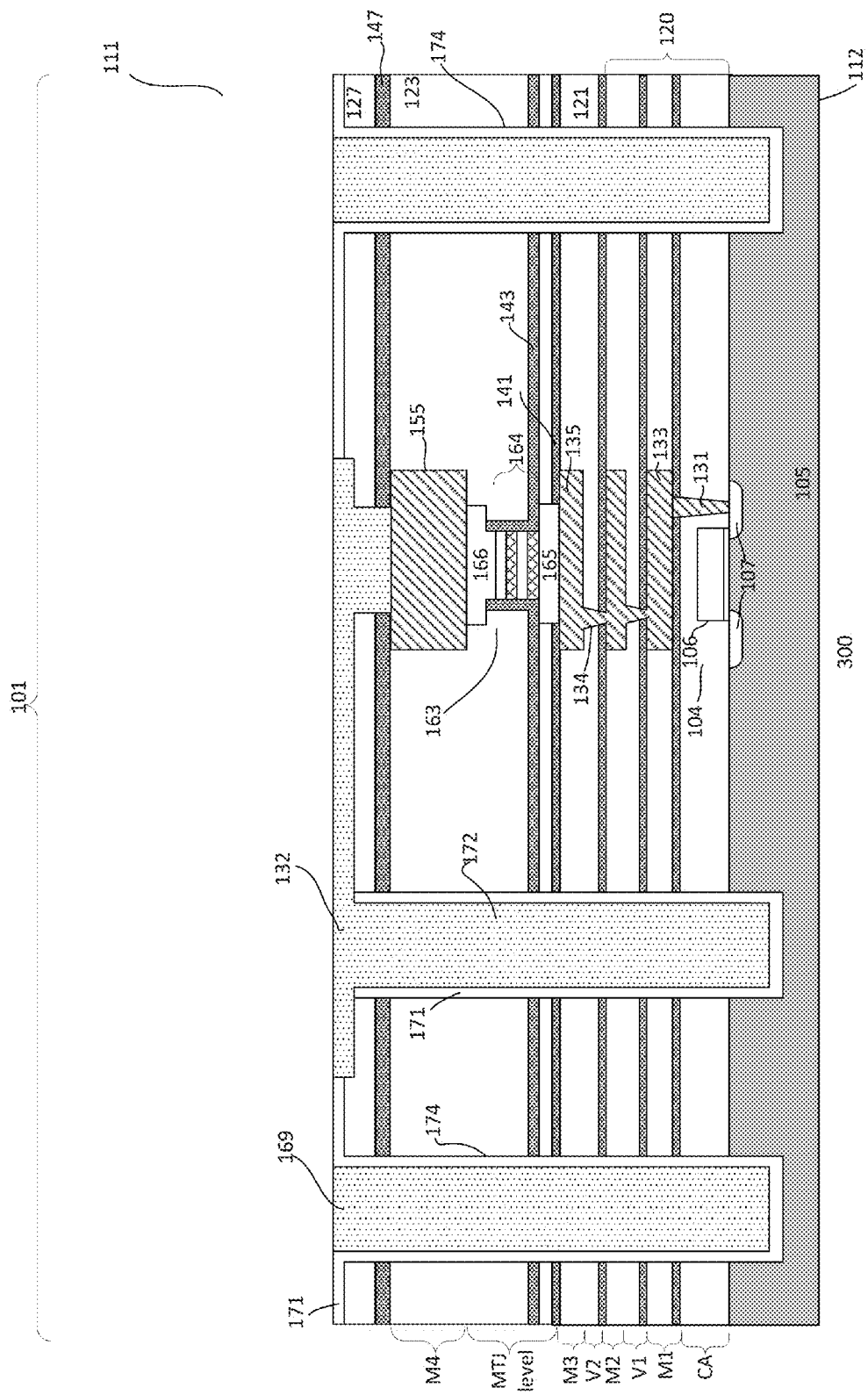

In one embodiment, the process 300 continues to form a magnetic shield layer 169 covering the dielectric liner 171 on the first surface 111. The magnetic shield layer, for example, includes a magnetic shield material that does not function by excluding a magnetic field from itself, but rather by collecting and concentrating the magnetic field lines into itself and thereby diverting the field from the magnetically sensitive components to be protected. For example, the magnetic shield layer includes NiFe (Mμ metal) layer. The magnetic shield layer may be formed by PVD or electrochemical deposition (plating). Other suitable magnetic shield material and forming technique may also be useful. In one embodiment, the magnetic shield layer completely fills the deep via and trench 372 and 374 as well as the pad interconnect opening 318 as shown in FIG. 3e. This simultaneously forms a through silicon via magnetic shield contact structure 172, a through silicon trench magnetic shield structure 174 and a pad interconnect having a die bump pad 132 and a via contact. In such case, the through silicon via magnetic shield contact structure 172 and the pad interconnect form a single unitary contact structure with the same magnetic shield material. The through silicon via magnetic shield structure 172 is coupled to the metal line 155 through the pad interconnect. Excess magnetic shield material may be removed by a planarization process, such as chemical mechanical polishing (CMP). As shown, the die bump pad 132 and the through silicon trench magnetic shield structure 174 have a substantially planar top surface on the first surface 111 of the wafer. In other embodiments, the pad interconnect opening and the deep via and trench may be filled with different materials.

Figure 3F:
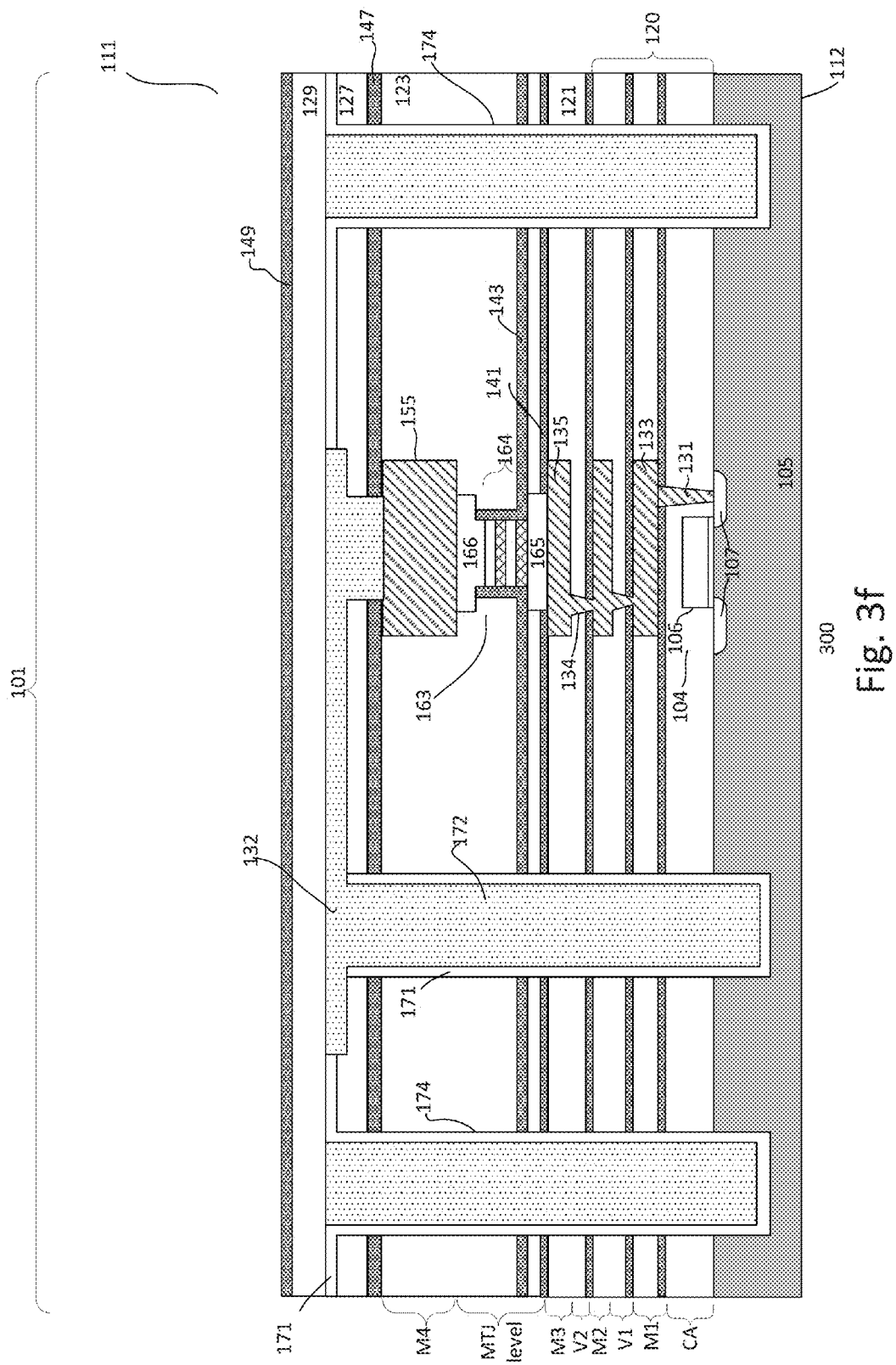

In FIG. 3f, the process 300 continues to form a passivation layer on the first surface (or front side) 111 of the wafer. In one embodiment, the process forms a first passivation layer 129 over the top surface of the top surface of the dielectric liner 171, pad interconnect and through silicon trench magnetic shield structure 174 while a second passivation layer 149 is formed over the first passivation layer. For example, the first passivation layer includes a passivation oxide layer having a thickness of about 5000 Å while the second passivation layer includes a passivation nitride layer having a thickness of about 4800 Å. The first and second passivation layers may be formed by CVD. Other suitable passivation materials, thicknesses and forming techniques may also be useful.

Figure 3G:
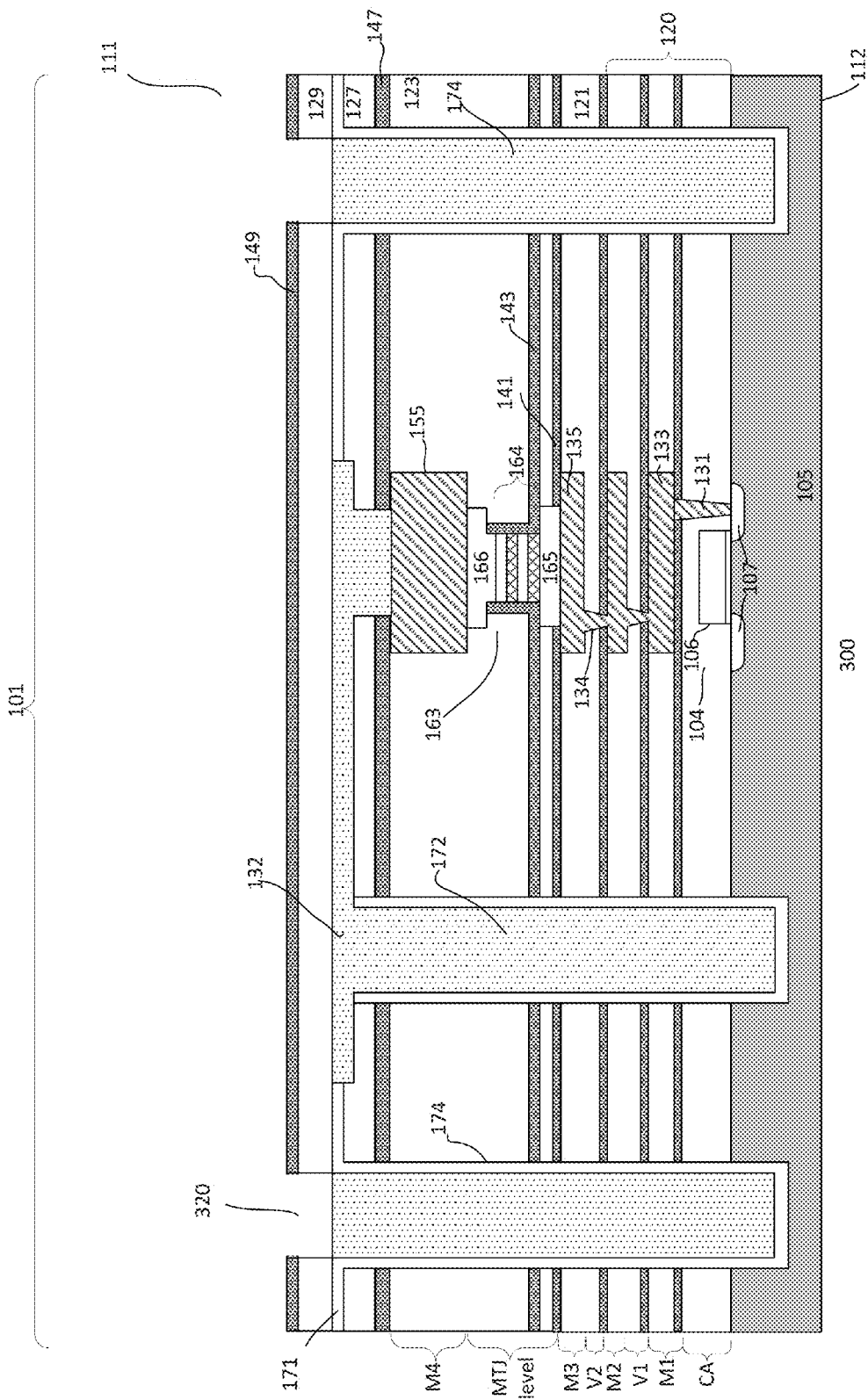

The process 300 continues to pattern the first and second passivation layers 129 and 149. Patterning the first and second passivation layers may be achieved using suitable mask and etch techniques. In one embodiment, the first and second passivation layers are patterned to form openings 320 which expose top surface of the through silicon trench magnetic shield structure 174 as shown in FIG. 3g. For example, exposed portions of the first and second passivation layers are removed by RIE. Other suitable techniques may also be useful.

Figure 3H:
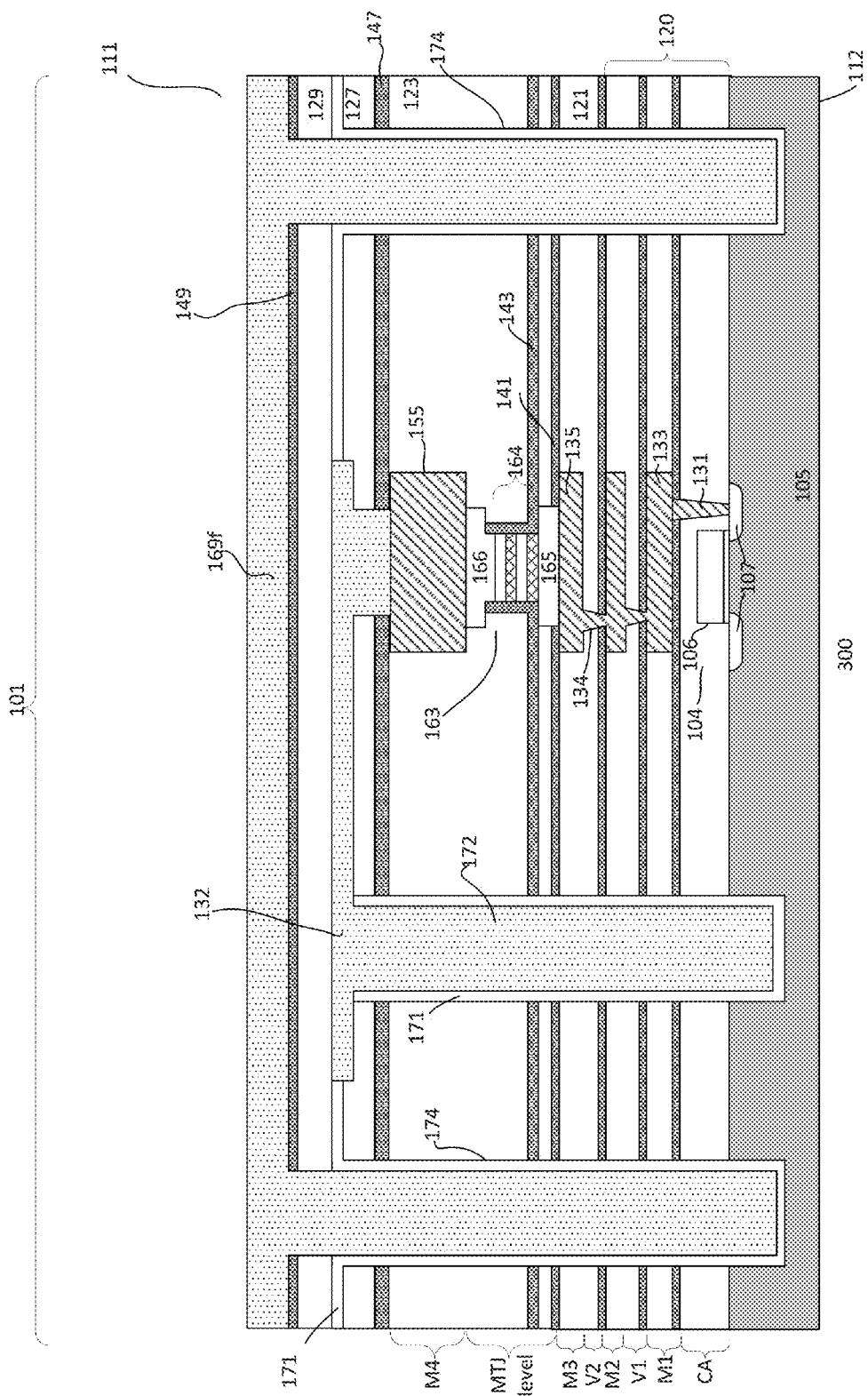

In one embodiment, the process 300 continues to form a magnetic shield layer covering the passivation layers on the first surface 111 and completely fills the openings 320 defined in the first and second passivation layers as shown in FIG. 3h. The magnetic shield layer, for example, includes the same or suitable magnetic shield material as described in FIG. 3e. The magnetic shield layer, for example, may be formed by PVD or ECD with a thickness of about 100-200 μm. Excess magnetic shield material may be removed by a planarization process, such as CMP. As shown, this forms a front side magnetic shield layer 169f on the first surface 111 of the wafer. Other suitable forming techniques and thicknesses may also be useful.

Figure 3I:
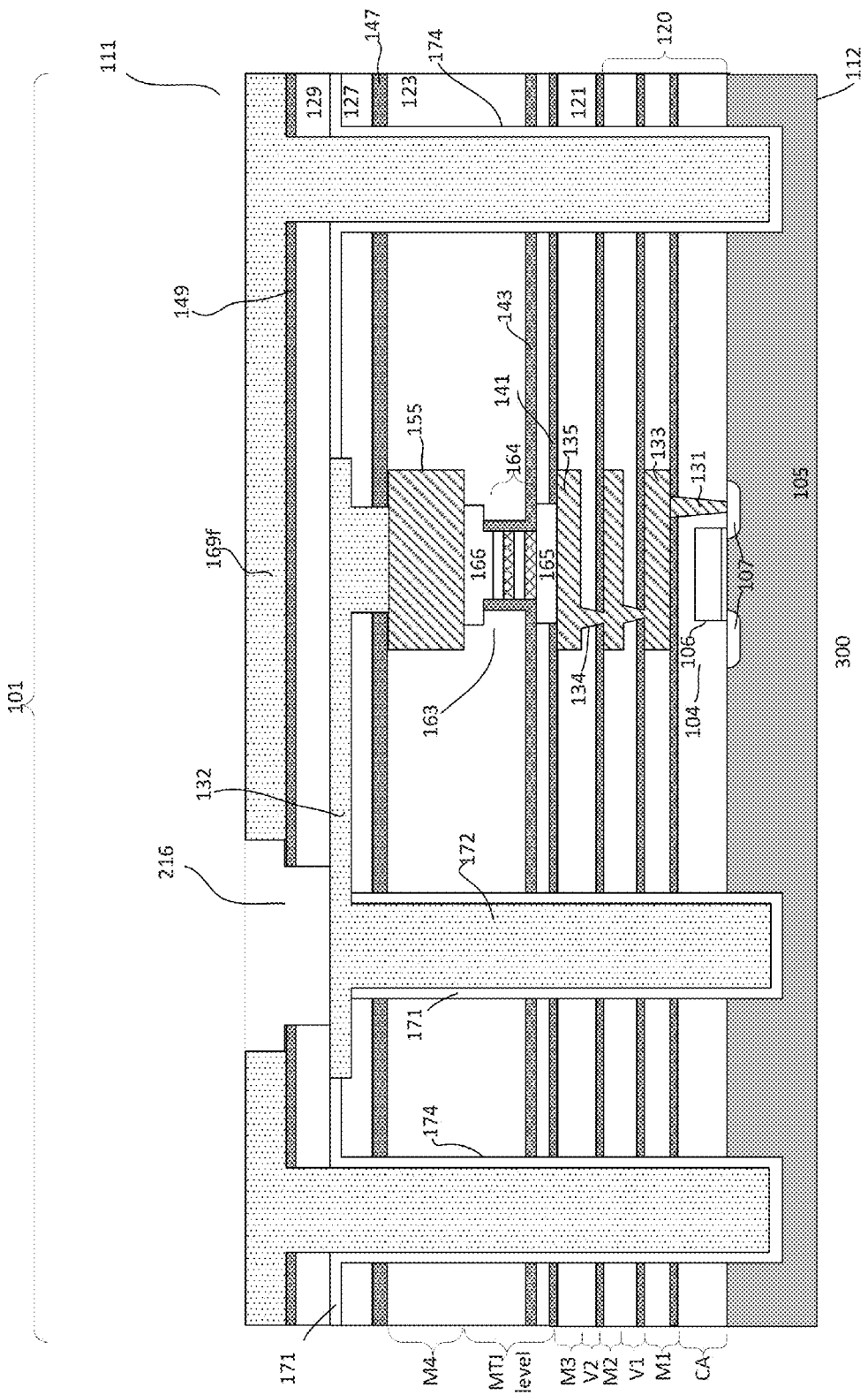

One or more die bump pad openings 216 are formed through the front side magnetic shield layer 169f and the passivation layers 129 and 149, exposing a portion of die bump pad 132 in the pad level. To form the die bump pad opening, the magnetic shield and passivation layers may be patterned using suitable mask and etch techniques. As shown, the die bump pad opening 216 exposes underlying die bump pad to connect to exterior devices. Referring to FIG. 3i, the opening may also be enlarged by removing additional portion of the front side magnetic shield layer 169f using suitable mask and etch technique to expose portions of the passivation layer 149 to form a die bump pad opening 216 described in FIG. 2c, which is configured for accommodating die microbumps for flip chip packaging.

Figure 3J:
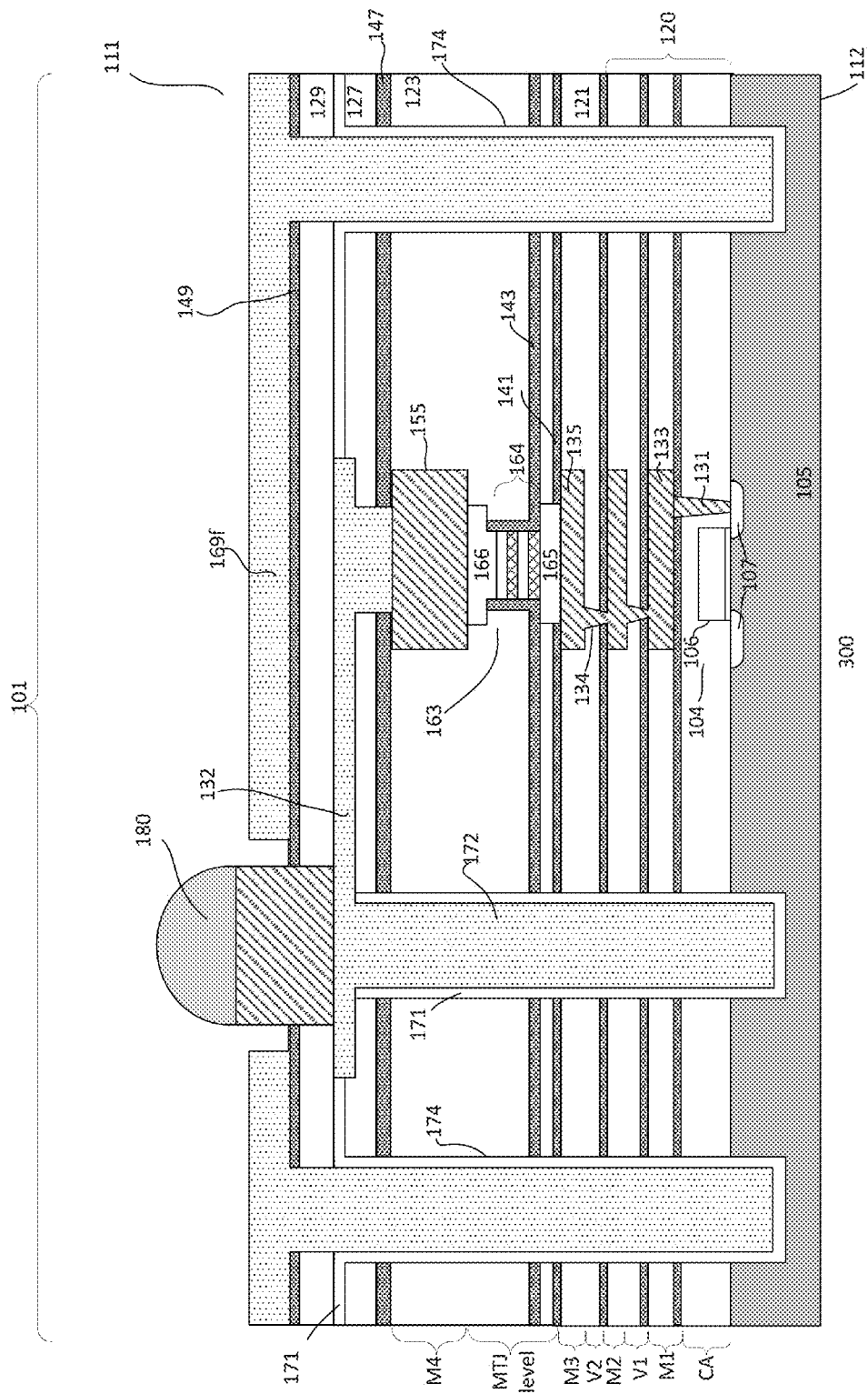

The process 300 continues by forming die microbump 180 coupled to the exposed portions of the die bump pad 132, as shown in FIG. 3j. The die microbump, for example, may include spherical shaped structures or balls and may be formed by bumping technique. The die microbumps are formed of a conductive material. The die microbumps, for example, can be formed from solder. Various types of solder can be used to form the die microbumps. For example, the solder can be a lead-based or non lead-based solder. In some embodiments, the die microbumps may be provided in the form of copper pillar with solder ball as shown in FIG. 3j. Such die microbumps may be formed by PVD, litho, plating, etching and bumping techniques. Other suitable types of die microbumps and forming techniques may also be useful. As shown, the die bump pad opening in the front side magnetic shield layer is sufficiently wide to isolate the die microbump 180 from the front side magnetic shield layer.

Referring to FIG. 3k, the process 300 continues by providing a support carrier 1020 having top and bottom surfaces. The support carrier, for example, is a temporary carrier for processing the wafer as processed and as described in FIG. 3j. The carrier should be sufficiently rigid to serve as a temporary support and withstand further processing steps. By way of non-limiting example, the support carrier may be a silicon wafer, conductive tape, metallic plate or the like. Various types of materials may be used to serve as the support carrier.

In one embodiment, an adhesive layer 1025 is provided on the top surface of the support carrier. Other temporary bonding techniques may also be useful. The adhesive, for example, can be any type of adhesive that provides temporary bonding of the wafer as processed and as described in FIG. 3j to the support carrier. The adhesive may include any suitable material and may be in different form. For example, the adhesive includes a B-stage dielectric material in the form of a tape, liquid or paste. The adhesive may be provided on the support carrier using various techniques. The technique employed may depend on the type or form of the adhesive. For example, a tape adhesive may be provided on the support carrier by lamination, a paste adhesive may be provided on the support carrier by printing while a liquid adhesive may be provided on the substrate by spin coating or dispensing.

The wafer as processed and as described in FIG. 3j is flipped such that the front side (or active surface) 111 of the wafer faces the support carrier 1020 while the back side (or inactive surface) 112 of the wafer faces upward as shown in FIG. 3l. In one embodiment, the process continues by attaching and bonding the wafer to the support carrier. As shown in FIG. 3l, the wafer is temporarily bonded to the support carrier through the adhesive.

The process 300 continues by removing a portion of the wafer substrate 105. In one embodiment, a portion of the wafer substrate is removed using a backgrinding process. A backgrinding process is then performed on the exposed back side (or inactive surface) 112 of the wafer. For example, the backgrinding process removes a portion of the wafer substrate and reduces the thickness of the wafer from an original thickness T1 to a reduced thickness T2 to reveal or expose bottom surface of the through silicon vias and trenches as shown in FIG. 3m. The thickness T2, for example, may be about 50-100 m. Other suitable techniques to remove a portion of the wafer substrate and final thickness dimensions of the wafer substrate may also be useful.

Figure 3N:
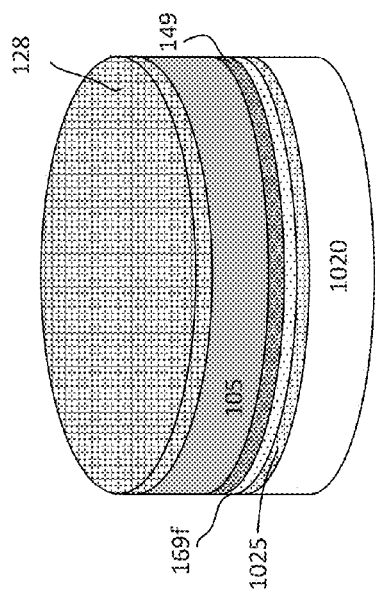
Figure 3M:
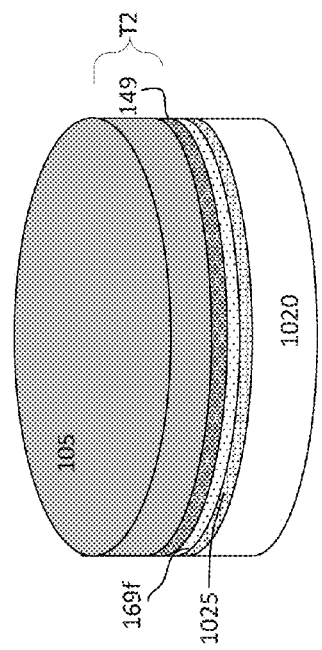

In one embodiment, the process 300 continues by depositing a dielectric layer 128 on the back side (or inactive surface) 112 of the thinned wafer as shown in FIG. 3n. The dielectric layer, for example, includes an adhesive or a silicon nitride layer. The adhesive or silicon nitride may be deposited by CVD. A plurality of openings may be formed through the dielectric layer by mask and etch techniques. For example, a patterned photoresist mask (not shown) may be formed over the dielectric layer, serving as an etch mask. An etch, such as RIE, may be used to pattern the dielectric layer with the patterned mask. The etch, for example, removes exposed portions of the dielectric layer to form openings exposing portions of the magnetic shield layer in the deep vias and trenches. For example, the etch removes the dielectric layer lining the bottom of the deep vias and trenches and exposes bottom surfaces of the through silicon via magnetic shield contact structure 172 and through silicon trench magnetic shield structure 174.

Figure 3O:
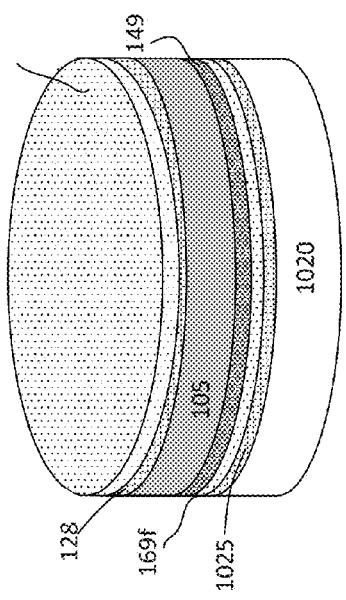

The process 300 continues by forming a magnetic shield layer 169b on the back side of the wafer substrate 105 having the dielectric layer 128 as shown in FIG. 3o. The magnetic shield layer 169b includes the same material as described for the magnetic shield layer 169f and is formed by PVD or ECD over the dielectric layer 128 and fills the openings in the dielectric layer. The magnetic shield layer 169b covers the second surface (inactive surface/back side) of the dies or chips processed in wafer format on the wafer. The magnetic shield layer 169b formed on the second surface (back side) 112 of the die protects the sensitive MTJ array from external magnetic field. The back side magnetic shield layer 169b is patterned using suitable mask and etch technique to expose bottom surface of the through silicon via magnetic shield contact structure 172

Figure 3Q:
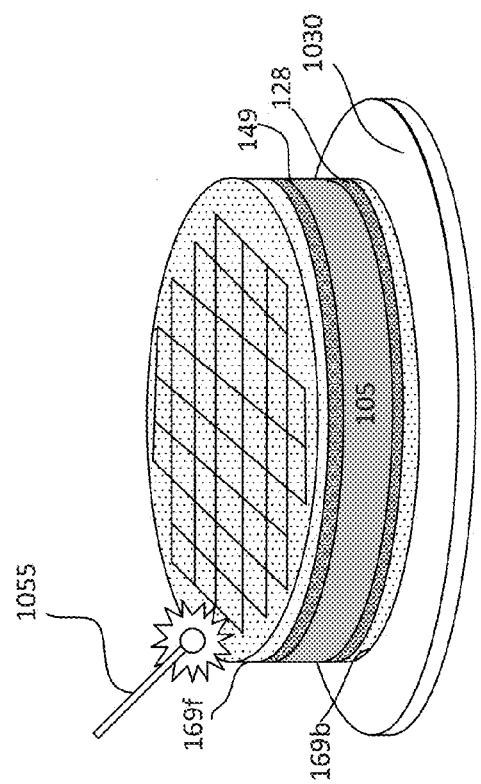
Figure 3P:
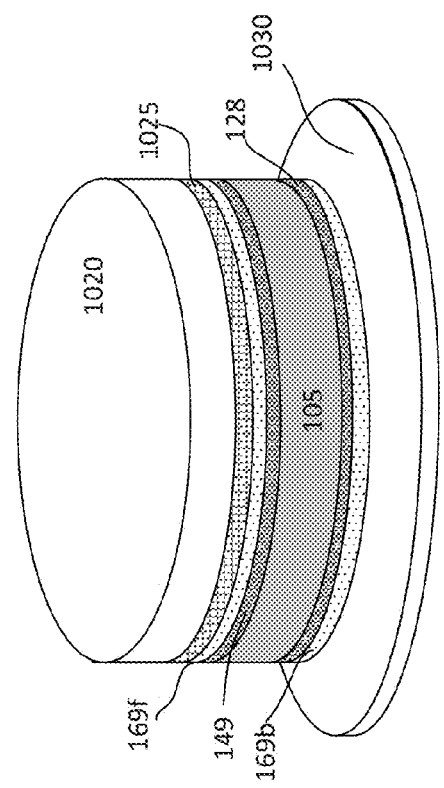

As shown in FIG. 3p, the wafer is provided on a support unit. The support unit, for example, includes a carrier tape or dicing tape 1030. Other suitable types of support unit which is sufficiently strong to provide temporary support may also be useful. The wafer is placed on the top surface of the dicing tape such that the second (or inactive) surface of the wafer 112 having the back side magnetic shield layer 169b contacts the top surface of the dicing tape while the first (or active) surface 111 of the wafer having the front side magnetic shield layer 169f is away from the dicing tape. In one embodiment, a debonding treatment is performed. The debonding treatment may, for example, cause the adhesive over the support carrier to lose or reduce its adhesive strength to allow separation of the wafer from the support carrier. The debonding treatment, for example, includes a temperature or heat treatment. Other suitable types of debonding treatments may also be useful. The debonding treatment may depend on the type of adhesive used. The debonding treatment may include chemical treatment, such as applying a solvent to dissolve the adhesive, or a mechanical treatment, such as pulling or twisting, to separate the wafer from the support carrier.

Referring to FIG. 3q, the removal of the support carrier exposes front side (or active surface) 111 of the wafer having the front side magnetic shield layer 169f. The process 1000 continues by performing a singulation process. The singulation process is performed through the scribe/saw lane regions (not shown). In one embodiment, the singulation process may be achieved by mechanical sawing, DRIE or other suitable techniques. In one embodiment, the singulation process singulates or separates the MRAM dies or chips in a wafer format through the scribe/saw lane regions to form individual MRAM chips or dies, such as that described and shown in FIGS. 2b-2c.

Figure 3R:
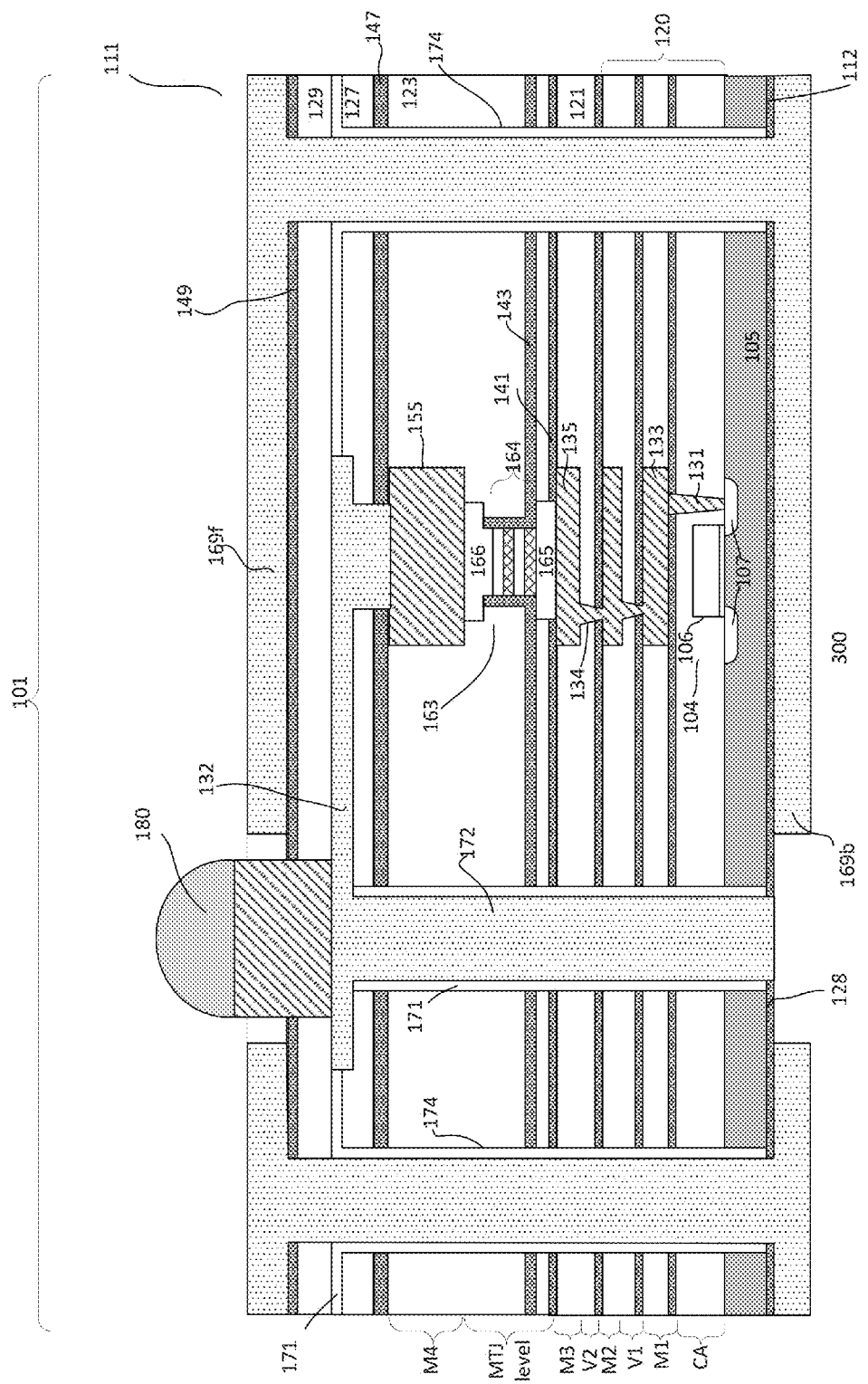

FIG. 3r shows a cross-sectional view of the singulated MRAM chip or die which is similar or the same as the MRAM die 210 as shown and as described in FIG. 2c. Referring to FIG. 3s, one or more singulated MRAM chip or die 210 of FIG. 3r may be vertically stacked on top of each other. As shown, the through silicon via magnetic shield contact structures 172 allow vertical stacking of the MRAM dies and provide for electrical connections between adjacent MRAM dies of the die stack to form a semiconductor package as shown in FIG. 2a. Further, the through silicon via magnetic shield contact structure is also coupled to the magnetic storage element through the pad interconnect. Thus, the through silicon via magnetic shield contact structure which includes a conductive magnetic shield material provides stacking capability as well as additional magnetic shielding to protect the MTJ bit element from external magnetic field in vertical direction. Further, the first surface (front side) 111 of the die or chips and through silicon trench magnetic shield structure 174 surrounding or adjacent to the MTJ array of the die are provided with front side and thick lateral magnetic shields. The front and back side magnetic shield layers covering the active and inactive surfaces of the die as well as the through silicon trench magnetic shield structure surrounding or adjacent to the MTJ array protects the MTJ bits from in-plane and perpendicular magnetic field interferences. The through silicon trench magnetic shield structure connects the front side magnetic shield with back side magnetic shield. Thus, the front side, back side and lateral/vertical shields of the MRAM die protect the MTJ array from external in-plane and perpendicular magnetic field interferences in all directions.

FIGS. 4a-4g show another embodiment of a process 400 for forming a MRAM chip or die. The process 400, for example, is similar to the process 300 as described in FIGS. 3a-3s and the MRAM chip or die formed by process 400 is similar or the same as the MRAM chip or die 110 as described in FIGS. 1a-1c. Common elements, indicated by the same reference numerals, may not be described or described in detail. In the interest of brevity, the description of the process 400 below primarily focuses on the difference(s) compared with the process 300 shown in FIGS. 3a-3s.

Figure 4A:
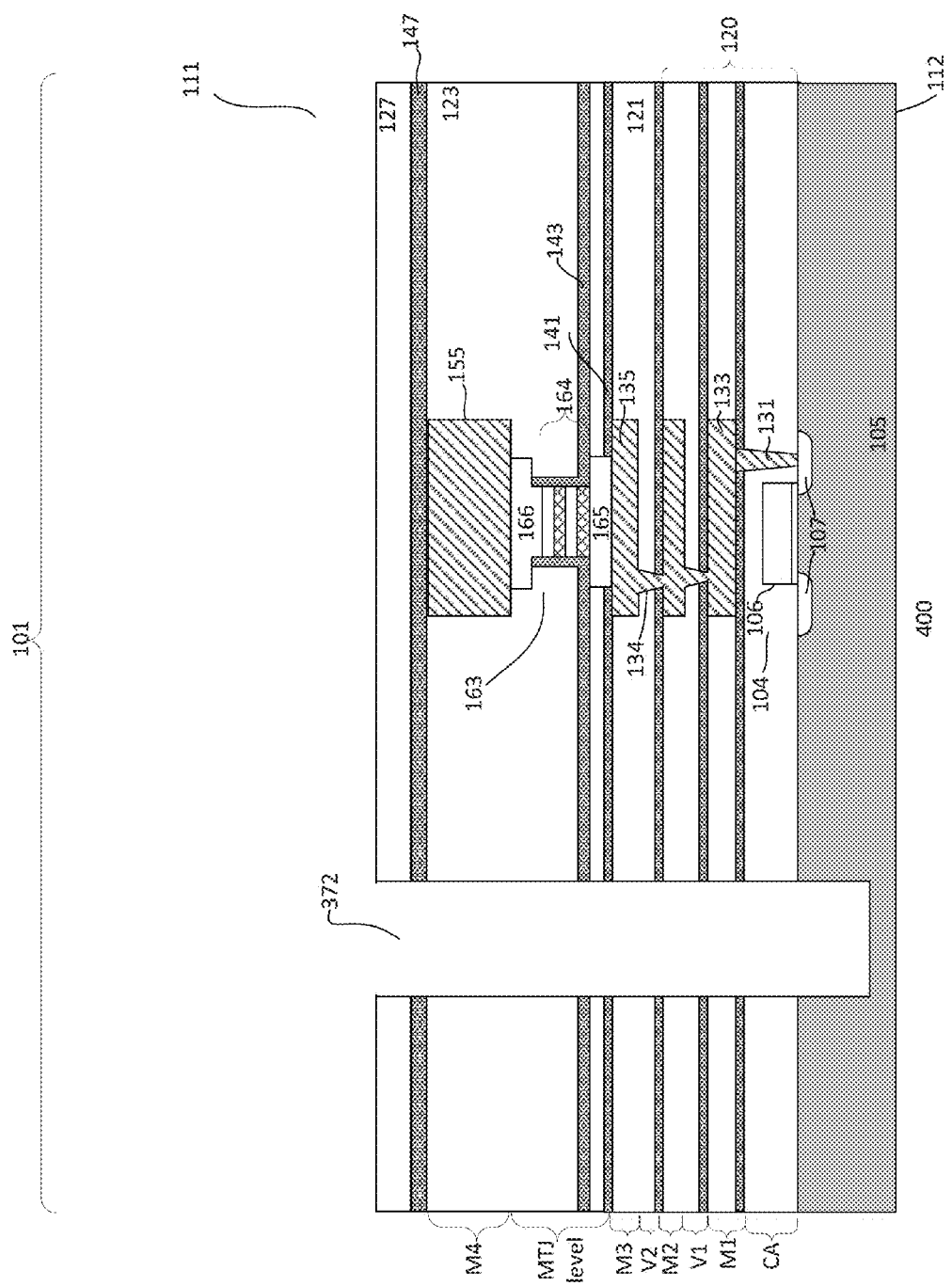
FIGS. 4a-4g show an exemplary embodiment of a process flow for forming a MRAM chip having through silicon via magnetic shield structure.

Referring to FIG. 4a, the process 400 is at the stage similar to that described in FIG. 3a. As shown, the MTJ array is defined within the MRAM region 101. For simplicity, only one MTJ bit from an array of MTJ bits is shown. The process 400 is at the stage of wafer level processing immediately after forming a pad level having a first pad dielectric layer 147 and a second pad dielectric layer 127 covering the metal line 155 in the uppermost upper ILD layer (e.g., M4).

Referring to FIG. 4a, the process 400 continues by introducing deep vias through the wafer. In one embodiment, the deep vias are formed within the MRAM region 101. For simplicity and illustration purpose, only one deep via is shown. It is understood that there could be other suitable number of deep vias. The deep via, in one embodiment, include through silicon via or through silicon hole opening 372 for accommodating a through silicon via magnetic shield contact structure. The deep via, for example, may be formed based on the layout pattern or design as shown and as described in FIG. 1b. For example, the through silicon via opening 372 are formed adjacent to the magnetic storage element when viewed from top. Other suitable layout pattern for the deep vias may also be useful. The deep via 372 may be formed using the technique and has the width and depth dimensions as described in FIG. 3b.

Figure 4B:
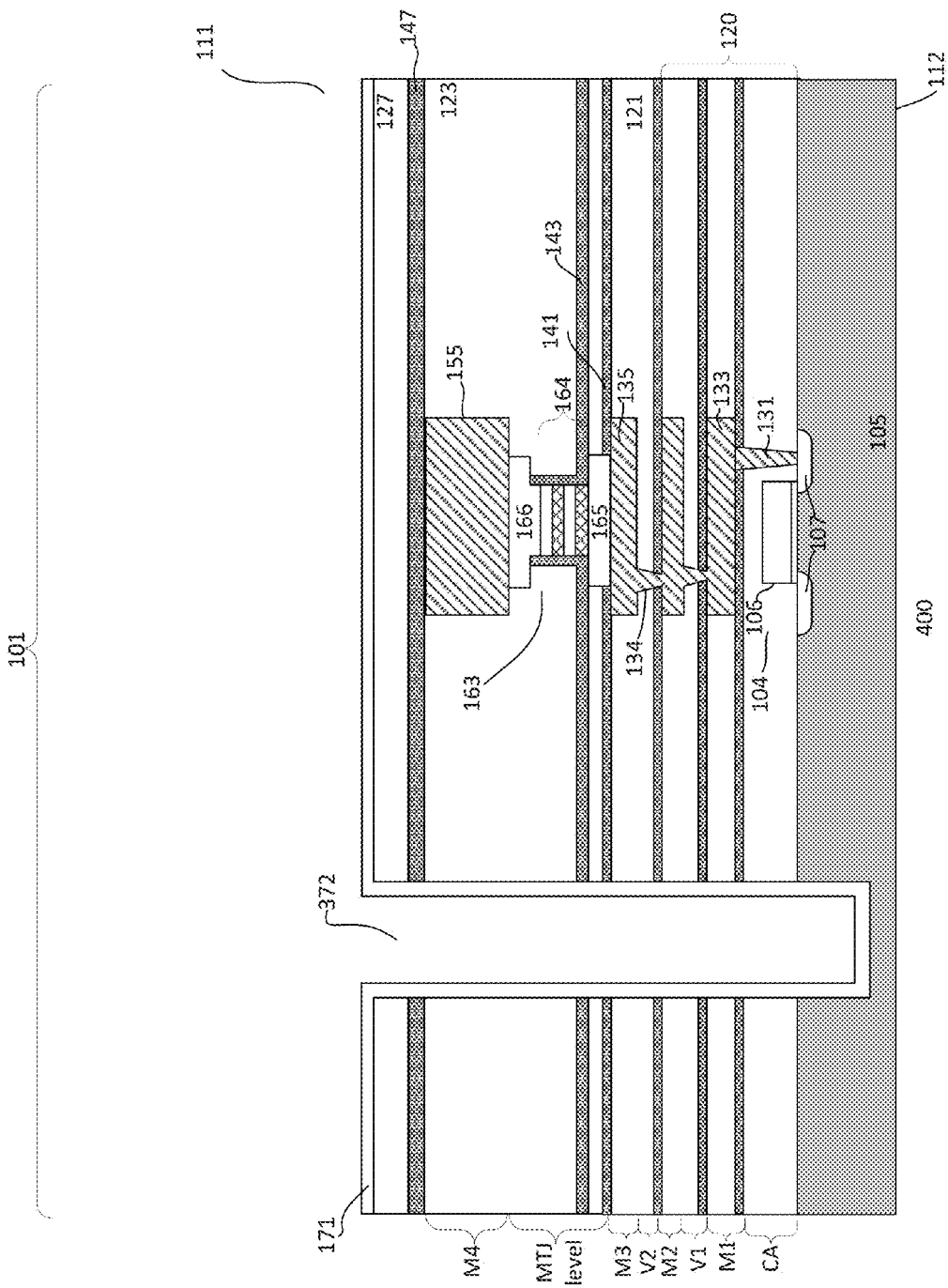
Figure 4C:
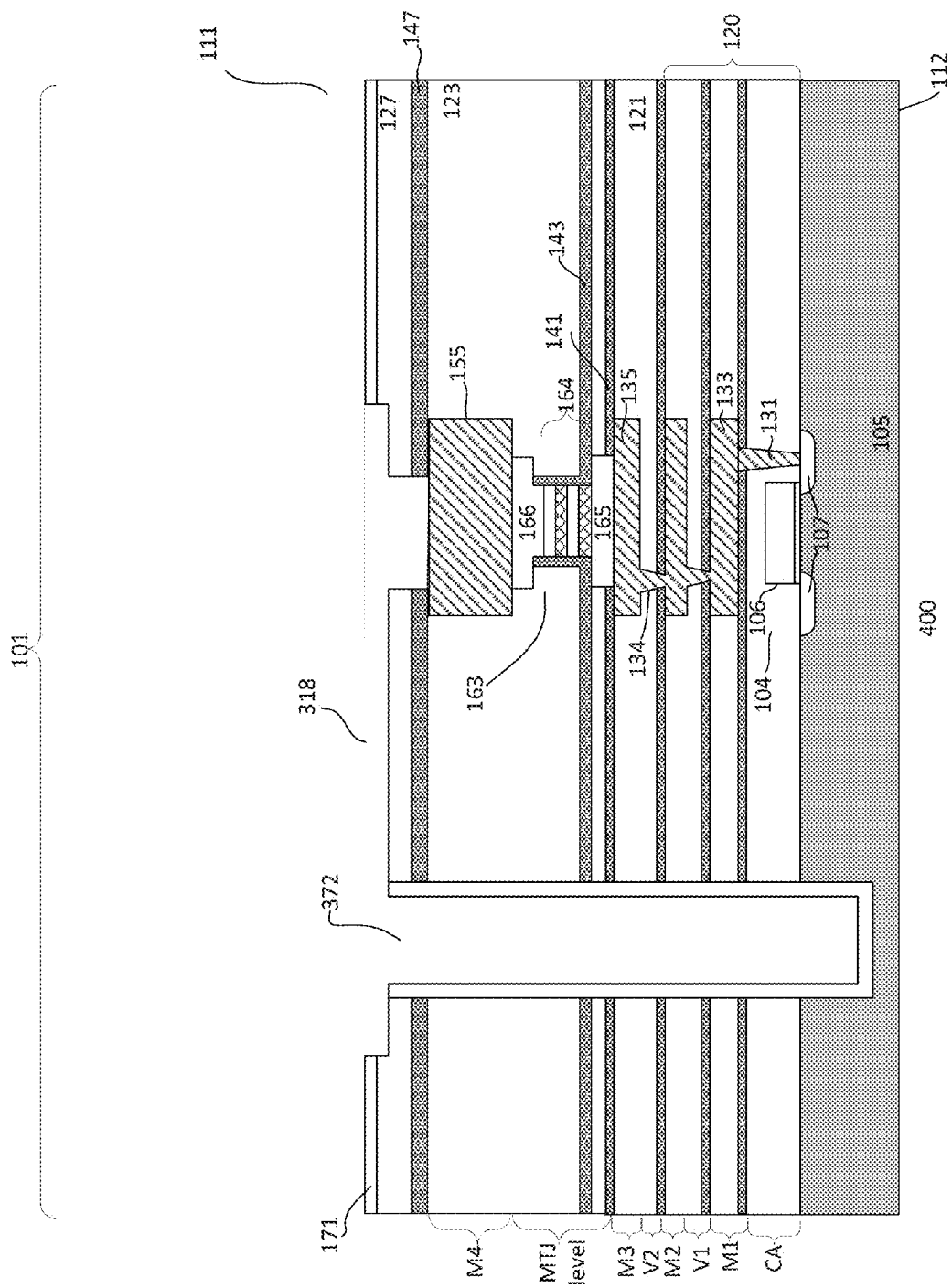

In FIG. 4b, the process 400 continues to form a dielectric liner 171 on the first surface (or front side) 111 of the wafer and sidewalls and bottom of the deep via 372. In one embodiment, the dielectric liner 171 and the pad level having the first and second pad dielectric layers 147 and 127 are patterned to define a pad interconnect opening 318 as shown in FIG. 4c. Material of the dielectric liner and techniques for forming the dielectric liner and to define the pad interconnect opening are the same as that described in FIGS. 3c-3d.

Figure 4D:
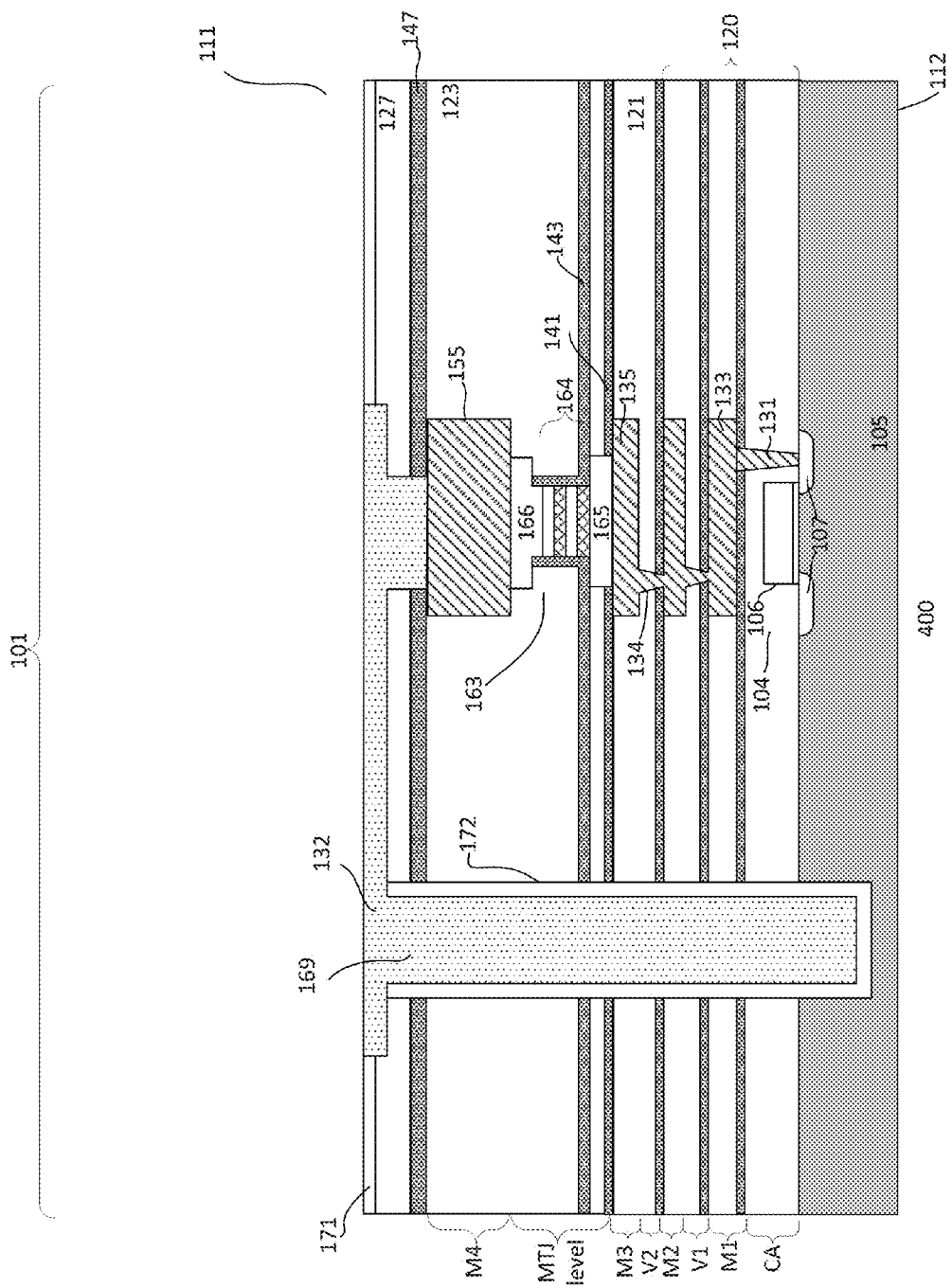

In one embodiment, the process 400 continues to form a magnetic shield layer 169 covering the dielectric liner 171 on the first surface 111. In one embodiment, the magnetic shield layer completely fills the deep via 372 as well as the pad interconnect opening 318 as shown in FIG. 4d. This simultaneously forms a through silicon via magnetic shield contact structure 172 and a pad interconnect having a die bump pad 132 and a via contact. In such case, the through silicon via magnetic shield contact structure 172 and the pad interconnect form a single unitary contact structure with the same magnetic shield material. The through silicon via magnetic shield structure 172 is coupled to the metal line 155 through the pad interconnect. Excess magnetic shield material may be removed by a planarization process. Materials and techniques for forming the magnetic shield layer as well as the planarization process are the same as that descried in FIG. 3e. As shown, the die bump pad 132 has a substantially planar top surface on the first surface 111 of the wafer. In other embodiments, the pad interconnect opening and the deep trench 372 may be filled with different materials.

Figure 4E:
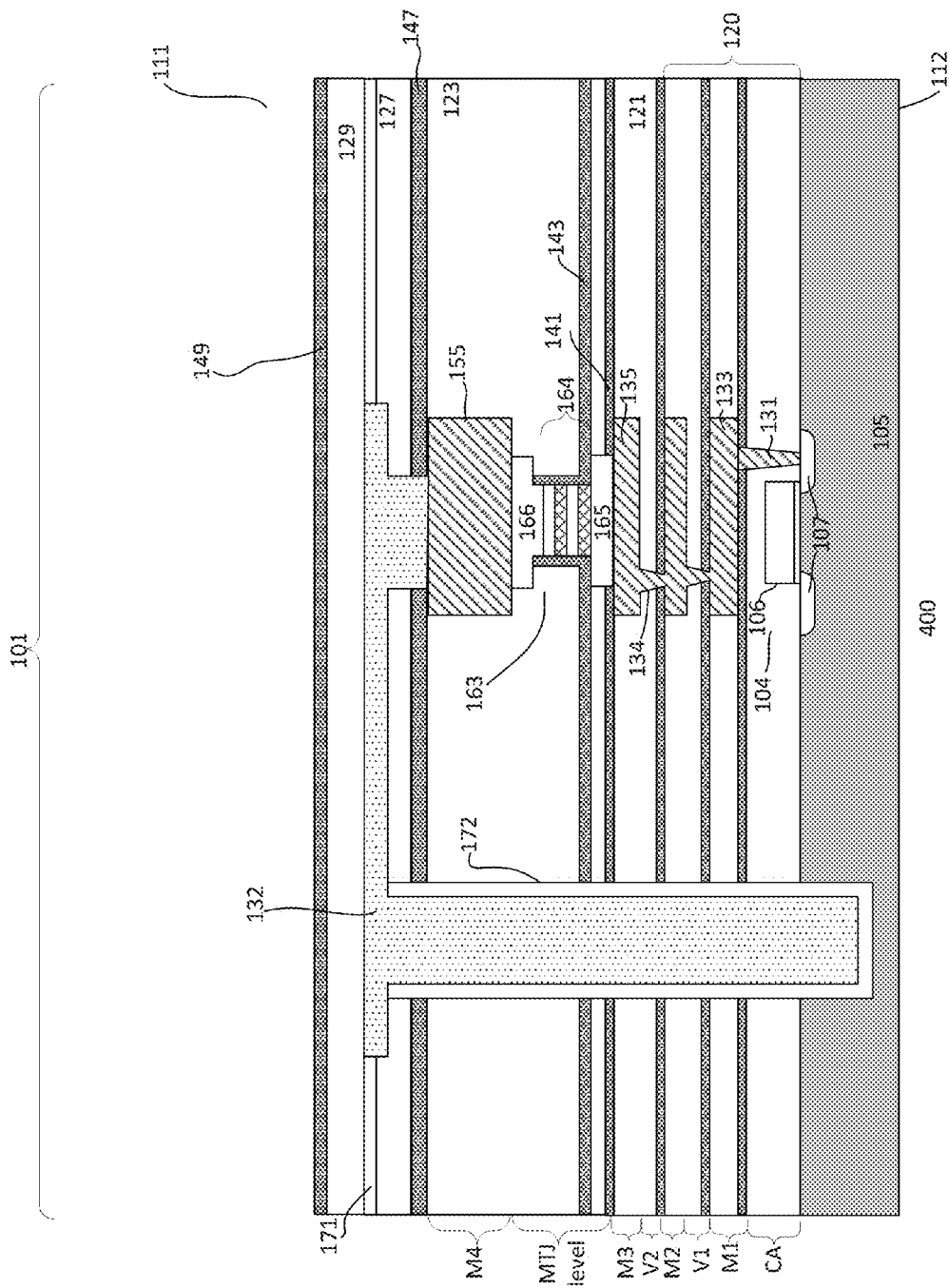

In FIG. 4e, the process 400 continues to form a passivation layer on the first surface (or front side) 111 of the wafer. In one embodiment, the process forms a first passivation layer 129 over the top surface of the top surface of the dielectric liner 171 and the pad interconnect while a second passivation layer 149 is formed over the first passivation layer. Materials and techniques for forming the first and second passivation layers are the same as that described in FIG. 3f.

One or more die bump pad openings 116 are formed through the first and second passivation layers 129 and 149, exposing a portion of die bump pad 132 in the pad level. To form the die bump pad opening, the passivation layers may be patterned using suitable mask and etch techniques. As shown, the die bump pad opening 116 exposes underlying die bump pad to connect to an exterior device, such as another MRAM die. The die bump pad opening 116 is configured for accommodating die microbumps for flip chip packaging.

Figure 4F:
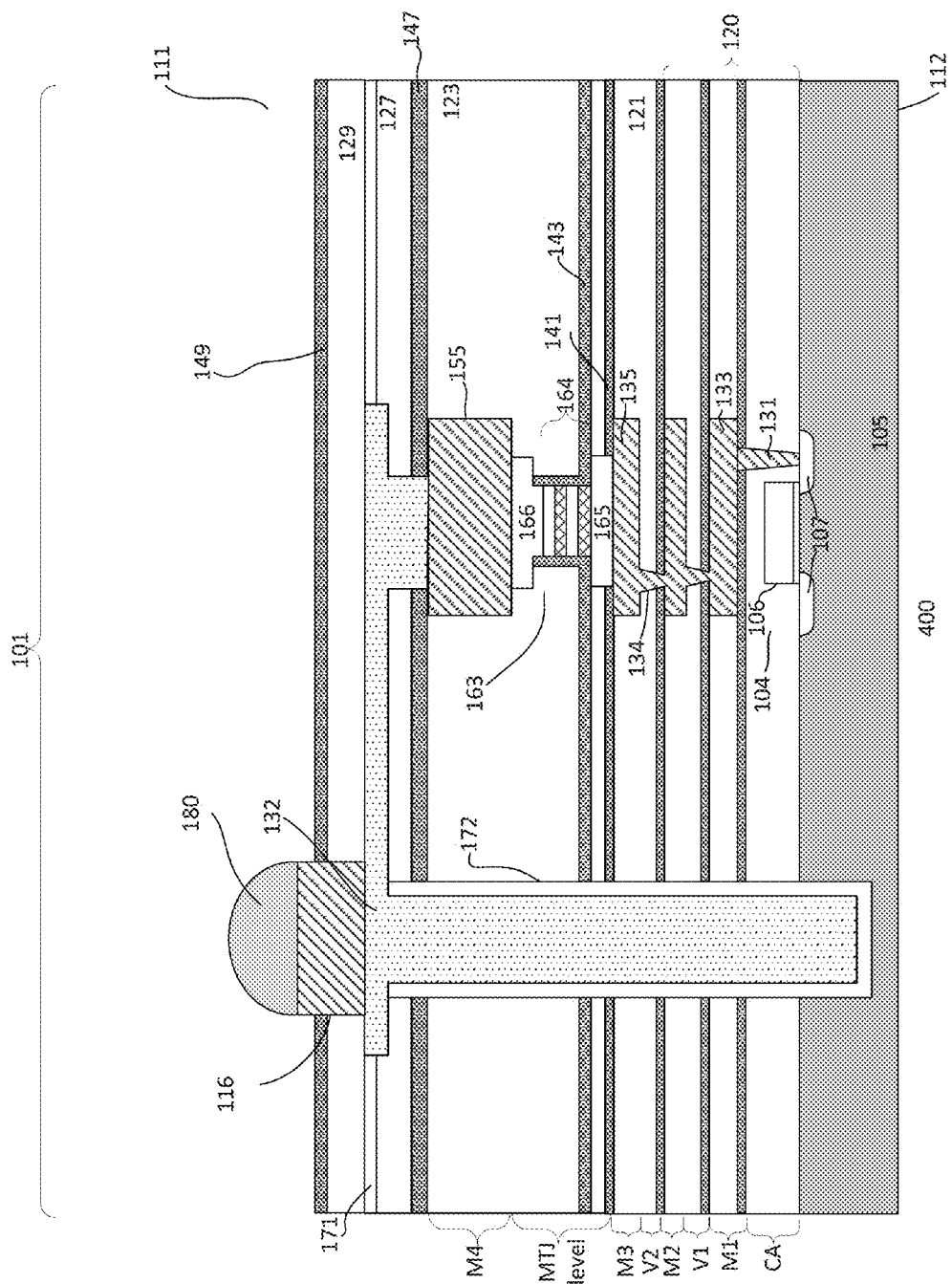

The process 400 continues by forming die microbump 180 coupled to the exposed portions of the die bump pad 132, as shown in FIG. 4f. The die microbump and techniques for forming the die microbumps are the same as that described in FIG. 3j.

The process 400 may continue by performing the processing as described in FIG. 3k to FIG. 3m. For example, the process 400 includes providing a support carrier prepared with an adhesive layer, and the wafer as processed and as described in FIG. 4f is flipped such that the front side (or active surface) 111 of the wafer faces the support carrier while the back side (or inactive surface) 112 of the wafer faces upward. The process 400 continues by removing a portion of the wafer substrate 105 using a backgrinding process to reduce the thickness of the wafer from an original thickness T1 to a reduced thickness T2. In one embodiment, the removal process also removes the dielectric liner lining the bottom of the deep via and exposes bottom surface of the through silicon via magnetic shield contact structure 172.

The process 400 continues by performing the processing as described in FIG. 3p and FIG. 3q. For example, the wafer is placed on a support unit and a debonding treatment is performed thereafter. The debonding treatment may, for example, cause the adhesive over the support carrier to lose or reduce its adhesive strength to allow separation of the wafer from the support carrier. The process 400 continues by performing a singulation process to separate the MRAM dies or chips in a wafer format through the scribe/saw lane regions to form individual MRAM chips or dies, such as that described and shown in FIGS. 1b-1c.

Figure 4G:
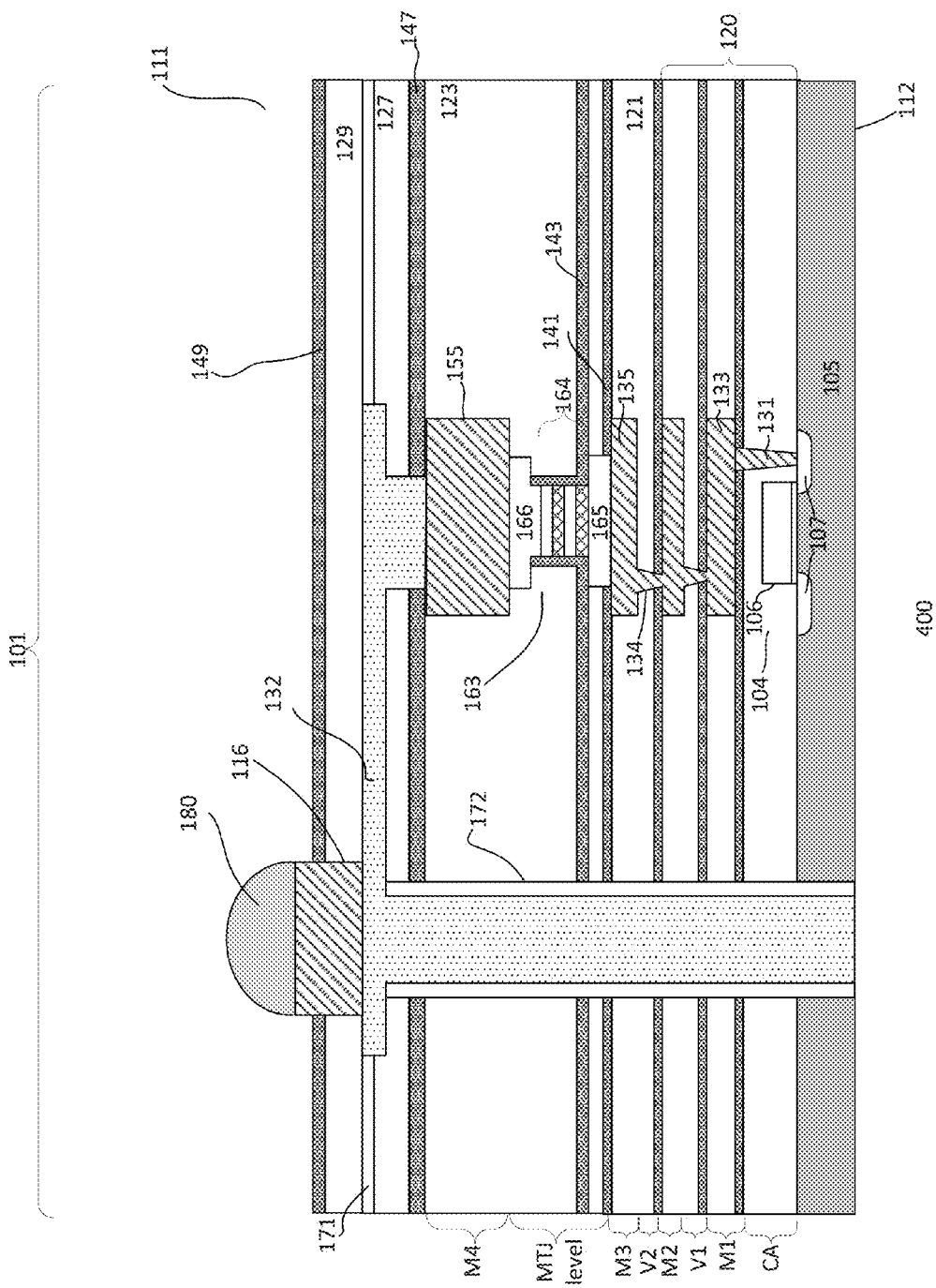

FIG. 4g shows a cross-sectional view of the singulated MRAM chip or die which is similar or the same as the MRAM die 110 as shown and as described in FIG. 1c. The one or more singulated MRAM chip or die 110 of FIG. 4g may be vertically stacked on top of each other. As shown, the through silicon via magnetic shield contact structures 172 allow vertical stacking of the MRAM dies 110 and provide for electrical connections between adjacent MRAM dies of the die stack to form a semiconductor package as shown in FIG. 1a. Further, the through silicon via magnetic shield contact structure is also coupled to the magnetic storage element through the pad interconnect. Thus, the through silicon via magnetic shield contact structure which includes a conductive magnetic shield material provides stacking capability as well as magnetic shielding to protect the MTJ bit element from external magnetic field in the vertical directions.

The process flows as described in this disclosure result in various advantages. For example, the MRAM chips as described have through silicon via magnetic shield structures and/or through silicon trench magnetic shield structures with front and back side magnetic shield layers provide for chip level magnetic shield protection for the in-plane as well as perpendicular MRAM chips. Furthermore, the chip level magnetic shield protections are processed at the wafer-level. Thus, the cycle time is lower compared to individual die packaging level magnetic shielding.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a magnetoresistive random access memory (MRAM) chip comprising:
   providing a substrate having first and second surfaces, wherein the first surface is defined with a MRAM region and the second surface of the substrate defines a back side of the MRAM chip;
   forming an upper inter level dielectric (ILD) layer over the first surface of the substrate, wherein the upper ILD layer comprises a plurality of ILD levels; and
   forming a magnetic storage element having a magnetic tunneling junction (MTJ) array with MTJ stack in the MRAM region and in between adjacent ILD levels of the upper ILD layer;
   forming a pad level over the magnetic storage element, wherein the pad level defines a front side of the MRAM chip; and
   forming at least a through silicon via magnetic shield contact structure which extends from the front side to the back side of the MRAM chip.

2. The method of claim 1 comprising forming a pad interconnect in the pad level.

3. The method of claim 2 wherein the pad interconnect couples the through silicon via magnetic shield contact structure to the magnetic storage element.

4. The method of claim 1 wherein forming at least a through silicon via magnetic shield contact structure comprises:
forming a deep via adjacent to the magnetic storage element, wherein the deep via extends from a top surface of the pad level and partially into a portion of the substrate; and
patterning the pad level to define a pad interconnect opening which is in communication with the deep via, wherein the pad interconnect opening comprises a pad opening and a via opening.

5. The method of claim 4 wherein forming at least a through silicon via magnetic shield contact structure further comprises completely and simultaneously filling the deep via and the pad interconnect opening with a magnetic shield layer to form the through silicon via magnetic shield contact structure in the deep via and a pad interconnect in the pad level, wherein the through silicon via magnetic shield contact structure and the pad interconnect form a single unitary contact structure.

6. The method of claim 1 comprising forming a passivation layer covering the pad level and the through silicon via magnetic shield contact structure.

7. The method of claim 6 comprising:
forming a die bump pad opening through a portion of the passivation layer over the front side of the MRAM chip;
forming a die microbump in the die bump pad opening and coupling the die microbump to the through silicon via magnetic shield contact structure; and
performing a removal process on the second surface of the substrate to expose a bottom surface of the through silicon via magnetic shield contact structure.

8. The method of claim 1 comprising forming a through silicon trench magnetic shield structure which extends from the front side to the back side of the MRAM chip and surround the MTJ array.

9. The method of claim 8 comprising:
forming a passivation layer covering the pad level, the through silicon via magnetic shield contact structure and the through silicon trench magnetic shield structure; and
patterning the passivation layer to form an opening which exposes a top surface of the through silicon trench magnetic shield structure.

10. The method of claim 9 comprising:
forming a front side magnetic shield layer over the front side of the MRAM chip, wherein the front side magnetic shield layer is coupled to the top surface of the through silicon trench magnetic shield structure; and
forming a back side magnetic shield layer over the back side of the MRAM chip, wherein the back side magnetic shield layer is coupled to a bottom surface of the through silicon trench magnetic shield structure.

11. The method of claim 1 comprising:
forming deep vias and trenches within the prime die region, wherein the deep vias and trenches comprise first type via opening which accommodates the through silicon via magnetic shield contact structure and second type trench opening which accommodates the through silicon trench magnetic shield structure, wherein the deep vias and trenches extend from a top surface of the pad level and partially into a portion of the substrate; and
patterning the pad level to define a pad interconnect opening which is in communication with the first type via opening of the deep via, wherein the pad interconnect opening comprises a pad opening and a via opening.

12. The method of claim 11 comprising completely and simultaneously filling the deep vias and trenches and the pad interconnect opening with a magnetic shield layer to form the through silicon via magnetic shield contact structure in the first type via opening and a pad interconnect in the pad level as well as the through silicon trench magnetic shield structure in the second type trench opening.

13. A magnetoresistive random access memory (MRAM) chip comprising:
a substrate having first and second surfaces, wherein the first surface is defined with a MRAM region and the second surface of the substrate defines a back side of the MRAM chip;
an upper inter level dielectric (ILD) layer disposed over the first surface of the substrate, wherein the upper ILD layer comprises a plurality of ILD levels; and
a magnetic storage element having a magnetic tunneling junction (MTJ) array with MTJ stack disposed in the MRAM region and in between adjacent ILD levels of the upper ILD layer;
a pad level disposed over the magnetic storage element, wherein the pad level defines a front side of the MRAM chip; and
at least a through silicon via magnetic shield contact structure which extends from the front side to the back side of the MRAM chip.

14. The MRAM chip of claim 13 comprising a pad interconnect disposed in the pad level.

15. The MRAM chip of claim 14 wherein the pad interconnect couples the through silicon via magnetic shield contact structure to the magnetic storage element.

16. The MRAM chip of claim 14 wherein the pad interconnect and the through silicon via magnetic shield contact structure include a magnetic shield material to form a single unitary contact structure.

17. The MRAM chip of claim 16 wherein the magnetic shield material includes NiFe (Mµ metal).

18. The MRAM chip of claim 13 comprising a through silicon trench magnetic shield structure which extends from the front side to the back side of the MRAM chip and surround the MTJ array.

19. The MRAM chip of claim 18 wherein the through silicon via magnetic shield contact structure and the through silicon trench magnetic shield structure comprise the same magnetic shield material.

20. The MRAM chip of claim 18 comprising:
a front side magnetic shield layer disposed over the front side of the MRAM chip, wherein the front side magnetic shield layer is coupled to a top surface of the through silicon trench magnetic shield structure; and
a back side magnetic shield layer disposed over the back side of the MRAM chip, wherein the back side magnetic shield layer is coupled to a bottom surface of the through silicon trench magnetic shield structure.

* * * * *